US008531007B2

(12) United States Patent
Okumura et al.

(10) Patent No.: US 8,531,007 B2
(45) Date of Patent: Sep. 10, 2013

(54) SEMICONDUCTOR DEVICE AND THE METHOD FOR MANUFACTURING THE SAME

(75) Inventors: Katsuya Okumura, Shinjuku-ku (JP); Hiroki Wakimoto, Matsumoto (JP); Kazuo Shimoyama, Matsumoto (JP); Tomoyuki Yamazaki, Matsumoto (JP)

(73) Assignees: Octec, Inc. (JP); Fuji Electric Co., Ltd. (JP)

( * ) Notice: Subject to any disclaimer, the term of this patent is extended or adjusted under 35 U.S.C. 154(b) by 169 days.

(21) Appl. No.: 12/784,162

(22) Filed: May 20, 2010

(65) Prior Publication Data

US 2011/0006403 A1     Jan. 13, 2011

(30) Foreign Application Priority Data

May 20, 2009   (JP) ................................. 2009-122440

(51) Int. Cl.
*H01L 29/06*     (2006.01)
*H01L 21/302*    (2006.01)

(52) U.S. Cl.
USPC ........... 257/620; 257/565; 257/622; 257/623; 257/E29.001; 257/E29.005; 257/E29.006; 257/E29.018; 257/E21.214; 438/462

(58) Field of Classification Search
USPC .................. 257/565, 620, 622, 623, E29.005, 257/E29.001, E29.006, E29.018, E21.214; 438/462
See application file for complete search history.

(56) References Cited

U.S. PATENT DOCUMENTS

| | | | |
|---|---|---|---|
| 6,737,722 B2 * | 5/2004 | Yamamoto et al. | 257/500 |
| 7,326,996 B2 | 2/2008 | Kaneda et al. | |
| 2006/0038206 A1 * | 2/2006 | Shimoyama et al. | 257/273 |
| 2007/0072359 A1 * | 3/2007 | Takei et al. | 438/234 |

FOREIGN PATENT DOCUMENTS

| | | |
|---|---|---|
| JP | 06-029375 A | 2/1994 |
| JP | 2001-185727 A | 7/2001 |
| JP | 2004-336008 A | 11/2004 |
| JP | 2005093972 A | 4/2005 |
| JP | 2006-190730 A | 7/2006 |
| JP | 2006-303410 A | 11/2006 |
| JP | 2008-053611 A | 3/2008 |

OTHER PUBLICATIONS

JP OA issued Jun. 18, 2013 for corres. JP 2009-122440 (partial English translation provided).

* cited by examiner

*Primary Examiner* — Peniel M Gumedzoe
(74) *Attorney, Agent, or Firm* — Rossi, Kimms & McDowell LLP

(57) ABSTRACT

A semiconductor device is disclosed which includes active section 100, edge termination section 110 having a voltage blocking structure and disposed around active section 100, and separation section 120 having a device separation structure and disposed around edge termination section 110. A surface device structure is formed on the first major surface of active section 100, trench 23 is formed in separation section 120 from the second major surface side, and $p^+$-type separation region 24 is formed on the side wall of trench 23 such that $p^+$-type separation region 24 is in contact with p-type channel stopper region 21 formed in the surface portion on the first major surface side and p-type collector layer 9 formed in the surface portion on the second major surface side. The semiconductor device and the method for manufacturing the semiconductor device according to the invention facilitate preventing the reverse blocking voltage from decreasing and shorten the manufacturing time of the semiconductor device.

17 Claims, 23 Drawing Sheets

US 8,531,007 B2

SEMICONDUCTOR DEVICE AND THE METHOD FOR MANUFACTURING THE SAME

BACKGROUND OF THE INVENTION

A. Field of the Invention

The present invention relates to power semiconductor devices and the method for manufacturing the power semiconductor devices. Specifically, the invention relates to bidirectional devices that exhibit bidirectional withstand voltage characteristics or reverse blocking devices that exhibit bidirectional withstand voltage characteristics.

B. Description of the Related Art

The insulated gate bipolar transistor (hereinafter referred to as the "IGBT"), that is one of the power semiconductor devices, is a one-chip power device that exhibits the high-speed switching performances and the voltage-driven performances, which the metal-oxide-semiconductor field-effect transistor (hereinafter referred to as the "MOSFET") exhibits. The IGBT also exhibits the low ON-state voltage characteristics which the bipolar transistor exhibits. The IGBT is applied to industrial equipment such as general purpose inverters, AC servos, uninterruptible power sources (hereinafter referred to as "UPS"), and switching power supplies. The IGBT is expanding its application fields to the livelihood instruments such as microwave ovens, electric rice cookers, and stroboscopes.

To convert an alternating current to another alternating current, that is to facilitate an AC/AC conversion, the use of a bidirectional switching device for a matrix converter and such a converter circuit of a direct link type has been investigated to reduce the size, weight, and costs of the circuit, to obtain a high conversion efficiency, and to realize a high-speed response. In order to obtain the bidirectional switching device described above by connecting IGBTs in opposite parallel, an IGBT that exhibits a certain reverse blocking voltage (hereinafter referred to as a "reverse blocking IGBT") has been desired.

In the following descriptions, electrons or holes are majority carriers in the semiconductor prefixed with "n-type" or "p-type". The symbol "+" or "−" on the shoulder of the letter "n" or "p" indicating the conductivity type of the semiconductor indicates that the semiconductor is doped relatively heavily or relatively lightly.

FIG. 24 is a cross sectional view which shows the structure of a conventional reverse blocking IGBT. As shown in FIG. 24, reverse blocking IGBT 270 of an n-channel type includes active section 100, edge termination section 110 having a voltage blocking structure (hereinafter referred to simply as "edge termination section 110"), and separation section 127 having a device separation structure (hereinafter referred to simply as "separation section 127"). Edge termination section 110 is disposed around active section 100 and separation section 127 around edge termination section 110.

In active section 100, p-type base region 2 is formed selectively in the surface portion on the first major surface side of semiconductor substrate 1 that works for an $n^-$-type drift layer. In the surface portion of p-type base region 2, $n^+$-type emitter region 3 is formed selectively. On the first major surface side, gate electrode 5 is disposed above the extended portion of p-type base region 2 extended between $n^+$-type emitter region 3 and semiconductor substrate 1 and above the extended portion of semiconductor substrate 1 extended between p-type base regions 2 with gate insulator film 4 interposed between the extended portions and the gate electrode 5. On the first major surface side, emitter electrode 7 is connected to the extended portion of p-type base region 2 extended between $n^+$-type emitter regions 3. Gate electrode 5 and emitter electrode 7 are isolated from each other by insulator film 6. Passivation film 8 is disposed on emitter electrode 7.

In edge termination section 110, p-type semiconductor region (hereinafter referred to as "p-type guard ring") 11 is formed selectively in the surface portion on the first major surface side of semiconductor substrate 1. Metal film (hereinafter referred to as "guard ring electrode") 13 is connected to p-type guard ring 11. The provision of p-type guard ring 11 and guard ring electrode 13 facilitates sustaining the withstand voltage in the forward direction.

On the second major surface on the back surface side of semiconductor substrate 1, p-type collector layer 9 is extended from active section 100 to separation section 127. Collector electrode 10 is disposed on p-type collector layer 9. In separation section 127, p-type separation region 91 is extended from the first major surface side of semiconductor substrate 1 to p-type collector layer 9 on the second major surface side.

The conventional IGBTs that do not exhibit any reverse blocking voltage substantially are manufactured based on the presumption that the conventional IGBTs will not be biased in reverse. A portion, to which an electric field is liable to localize by a reverse bias voltage applied, is caused in the cut plane near the collector junction plane by dicing and such causes. The mechanical strain caused by dicing and such causes usually remains. In other words, any treatment for securing a certain withstand voltage in the cut plane near the collector junction plane is not conducted. Therefore, a sufficient reverse blocking voltage is not obtained.

Reverse blocking IGBT 270 secures a reverse blocking voltage equivalent to the forward blocking voltage by the depletion layers that expand into $n^-$-type drift layer (substrate) 1 from p-type separation region 91 formed on the chip side wall and p-type collector layer 9 in the reversely biased state, in which the emitter side is biased at a positive potential and the collector side at a negative potential. Since reverse blocking IGBT 270 sustains the forward blocking voltage and the reverse blocking voltage as described above, reverse blocking IGBT 270 is expected to be applicable to the matrix converter and such converters, which are capable of directly converting an AC to another AC, the frequency of which is different from the frequency of the source AC.

In manufacturing reverse blocking IGBT 270, p-type separation region 91 is formed first by diffusing an impurity selectively from the first major surface side of semiconductor substrate 1. Then, the following steps are conducted in the same manner as in forming the ordinary n-channel IGBTs. First, the surface device structure is formed on the first major surface. Then, the back surface side of semiconductor substrate 1 is ground. The ion implantation through the second major surface on the back surface side of semiconductor substrate 1 and the subsequent thermal activation are conducted. Collector electrode 10 is formed by vacuum deposition or by sputtering.

In manufacturing a reverse blocking IGBT of the 1200 V class, diffusion is conducted in an early stage at a high temperature and for a long time from the front surface side in the region which will be dicing line 130. And, p-type separation region 91 of approximately 200 μm in depth is formed. In manufacturing a reverse blocking IGBT of the 600 V class, p-type separation region 91 of approximately 100 μm in depth is formed. At the end of the manufacturing process, p-type separation region 91 is continuous to p-type collector layer 9. After dicing, p-type separation region 91 is exposed to the chip side wall.

In manufacturing conventional reverse blocking IGBT 270, diffusion is conducted at a high temperature for a long time to form p-type separation region 91. Therefore, it is necessary to employ a very thick diffusion mask that causes the manufacturing costs to soar. As the withstand voltage is higher, it is necessary for p-type separation region 91 to be deeper, impairing the throughput through a diffusion furnace badly. Since the diffusion is conducted from the first major surface side of semiconductor substrate 1, the width of p-type separation region 91 is as large as the depth thereof, increasing the occupied area ratio of p-type separation region 91 and widening the chip area.

To obviate the problems described above, Japanese Unexamined Patent Application Publication No. 2004-336008 proposes a manufacturing method that forms a trench first before forming p-type separation region 91 on the first major surface side of semiconductor substrate 1 and then forms p-type separation region 91 using the trench.

However, it is necessary for the technique disclosed in Japanese Unexamined Patent Application Publication No. 2004-336008 to conduct complicated treatments in filling the trench with polysilicon so as not to damage the inside of the trench. It is relatively easy to fill the trench with an insulator. However, the insulator buried in the trench is etched by the etching conducted in forming the surface device structure on the first major surface.

When a trench is bored through the substrate by the technique disclosed in Japanese Unexamined Patent Application Publication No. 2004-336008 to make the dicing unnecessary, many steps are necessary to form the device after the trench is formed and the trench corner on the second major surface side will be broken with a high probability. Based on the technique disclosed in Japanese Unexamined Patent Application Publication No. 2004-336008, the diffusion proceeds from the first major surface side. Therefore, the impurity concentration in the trench corner on the second major surface side is lower. Therefore, if the trench corner on the second major surface side is broken, the reverse blocking voltage will be lowered.

In view of the foregoing, it would be desirable to obviate the problems described above. It would be also desirable to provide a semiconductor device and the manufacturing method thereof that facilitate preventing the reverse blocking voltage from decreasing. It would be further desirable to provide a semiconductor device and the manufacturing method thereof that allows manufacturing time of a semiconductor to be shortened.

The present invention is directed to overcoming or at least reducing the effects of one or more of the problems set forth above.

SUMMARY OF THE INVENTION

According to the subject matter of the appended Claim 1, there is provided a semiconductor device including:
an active section in a semiconductor substrate of a first conductivity type;
a edge termination section in the semiconductor substrate, the edge termination section having a voltage blocking structure, the edge termination section surrounding the active section; and
a separation section in the edge area of the semiconductor substrate, the separation section having a device separation structure, the separation section surrounding the edge termination section, the separation section including:
a common semiconductor region of a second conductivity type in the surface portion on the second major surface side of the semiconductor substrate, the common semiconductor region being disposed commonly to the active section, the edge termination section and the separation section;
a back surface side electrode on the common semiconductor region;
a first semiconductor region of the second conductivity type in the surface portion on the first major surface side of the semiconductor substrate,
an insulator film on the first semiconductor region;
a trench formed from the second major surface side of the semiconductor substrate, and
a second semiconductor region of the second conductivity type formed along the side wall of the trench, the second semiconductor region being in contact with the common semiconductor region and the first semiconductor region, and including a boundary portion between the side wall of the trench in the opening thereof and the second major surface of the semiconductor substrate, the boundary portion of the second semiconductor region being wider than the other portion of the second semiconductor region excluding the boundary portion or the boundary portion of the second semiconductor region being doped more heavily than the other portion of the second semiconductor region.

According to the subject matter of the appended Claim 2, the trench is over a dicing line for cutting the adjacent semiconductor devices apart.

According to the subject matter of the appended Claim 3, the trench is not over a dicing line for cutting the adjacent semiconductor devices apart.

According to the subject matter of the appended Claim 4, the semiconductor device further includes a branch trench extended from the trench to the dicing line.

According to the subject matter of the appended Claim 5, the common semiconductor region and the second semiconductor region are epitaxial regions of the second conductivity type.

According to the subject matter of the appended Claim 6, the semiconductor device further includes an insulator buried in the trench.

According to the subject matter of the appended Claim 7, the insulator is boro-silicate glass.

According to the subject matter of the appended Claim 8, the trench is formed through the semiconductor substrate and any insulator is not buried in the trench.

According to the subject matter of the appended Claim 9, a plurality of the separation section is disposed discontinuously around the edge termination section.

According to the subject matter of the appended Claim 10, there is provided a semiconductor device including:
an active section in a semiconductor substrate of a first conductivity type;
a edge termination section in the semiconductor substrate, the edge termination section having a voltage blocking structure, the edge termination section surrounding the active section; and
a separation section in the edge area of the semiconductor substrate, the separation section having a device separation structure, the separation section surrounding the edge termination section and including:
a common semiconductor region of a second conductivity type in the surface portion on the second major surface side of the semiconductor substrate, the common semiconductor region being disposed commonly to the active section, the edge termination section and the separation section;

a back surface side electrode on the common semiconductor region;

a first semiconductor region of the second conductivity type in the surface portion on the first major surface side of the semiconductor substrate, an insulator film on the first semiconductor region;

a trench formed by etching from the first major surface side of the semiconductor substrate, an insulator in the trench; and a second semiconductor region of the second conductivity type formed along the side wall of the trench, the second semiconductor region being in contact with the common semiconductor region and the first semiconductor region.

According to the subject matter of the appended Claim 11, there is provided a method for manufacturing a semiconductor device including an active section in a semiconductor substrate of a first conductivity type, a edge termination section in the semiconductor substrate, the edge termination section having a voltage blocking structure, the edge termination section surrounding the active section, and a separation section in the edge area of the semiconductor substrate, the separation section having a device separation structure, the separation section surrounding the edge termination section, the method including the steps of:

(a) forming a surface device structure on the first major surface of the semiconductor substrate in the active section, forming a first semiconductor region of a second conductivity type in the surface portion on the first major surface side of the semiconductor substrate in the separation section, and forming an insulator film on the first semiconductor region;

(b) forming a trench from the second major surface side of the semiconductor substrate in the separation section;

(c) forming a second semiconductor region of the second conductivity type on the side wall of the trench such that the second semiconductor region is connected to the first semiconductor region;

(d) forming a front surface electrode on the first major surface of the semiconductor substrate;

(e) forming a common semiconductor region of the second conductivity type on the second major surface of the semiconductor substrate; and (f) forming a back surface electrode on the common semiconductor region.

According to the subject matter of the appended Claim 12, the method further includes the step of (g) burying an insulator in the trench.

According to the subject matter of the appended Claim 13, the method further includes the step of (h) burying borosilicate glass in the trench, the step (h) being conducted between the steps (b) and (c), and the step (c) includes a thermal treatment diffusing an impurity of the second conductivity type from the boro-silicate glass to form the second semiconductor region.

According to the subject matter of the appended Claim 14, the trench is formed using the insulator film for an etching stopper in the step (b).

According to the subject matter of the appended Claim 15, the trench is formed over a dicing line for cutting adjacent ones of the semiconductor device apart.

According to the subject matter of the appended Claim 16, the trench is formed not over a dicing line for cutting adjacent ones of the semiconductor device apart.

According to the subject matter of the appended Claim 17, the second semiconductor region and the common semiconductor region are formed simultaneously by epitaxial growth from the semiconductor substrate.

According to the subject matter of the appended Claim 18, the step (b) further includes forming a branch trench extended to the dicing line from the trench formed in the separation section.

According to the subject matters of the appended Claim 1 through 4, 6 through 9, and 11 through 16, a trench is formed from the second major surface side of the semiconductor substrate in the separation section. A second semiconductor region of the second conductivity type is formed on the side wall of the trench and a common semiconductor region of the second conductivity type is formed on the second major surface. When these semiconductor regions of the second conductivity type are formed, the common semiconductor region of the second conductivity type is formed also in a boundary region between the side wall of the trench in the opening thereof and the second major surface. In the boundary region, the second semiconductor region of the second conductivity type has been formed already. Therefore, the boundary portion of the second semiconductor region between the side wall of the trench in the opening thereof and the second major surface is wider than (or doped more heavily than) the other portion of the second semiconductor region excluding the boundary portion thereof. Therefore, the reverse blocking voltage will be prevented from decreasing, even if cracks or fissures are caused in the boundary region between the side wall of the trench in the opening thereof and the second major surface during the manufacture of the semiconductor device.

According to the subject matters of the appended Claim 1 through 6 and 9 through 18, it is possible to bury an insulator in the trench after forming a surface device structure on the first major surface of the semiconductor substrate. Since the infill once buried in the trench is hardly etched, it is possible to bury an insulator for the infill. Therefore, an insulator may be buried in the trench more easily than a semiconductor such as polysilicon.

According to the subject matter of the appended Claim 5 or 17, it is possible to form the second semiconductor region and the common semiconductor region simultaneously. Therefore, manufacturing time of a semiconductor device is shortened.

The semiconductor device and the method for manufacturing the semiconductor device according to the invention facilitate preventing the reverse blocking voltage from decreasing and shorten manufacturing time for the semiconductor device.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Figure 1:
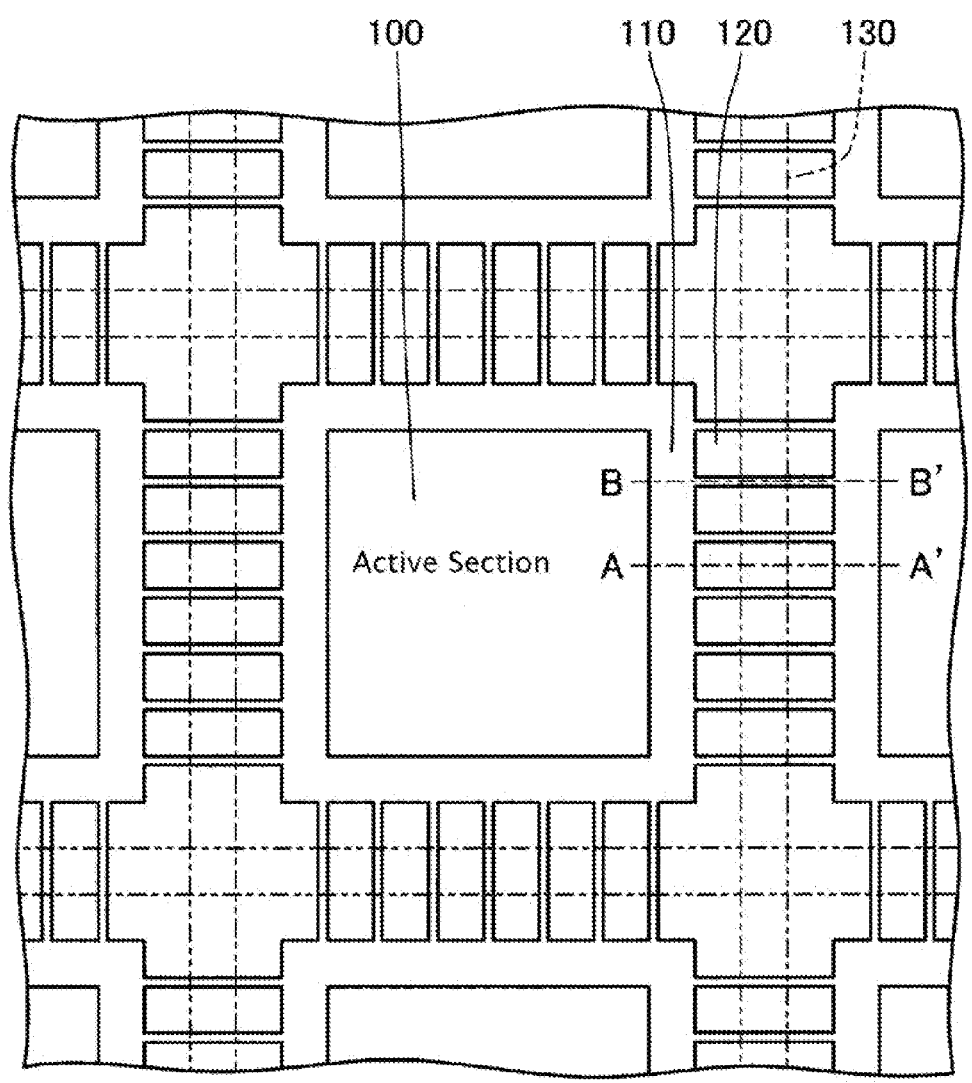
FIG. 1 is a top plan view showing the structure of a semiconductor device according to a first embodiment of the invention.

Now the invention will be described in detail hereinafter with reference to the accompanied drawings which illustrate the preferred embodiments of the invention. In the following descriptions, the same reference numerals are used to designate the same constituent elements and their duplicated descriptions are omitted for the sake of simplicity.

First Embodiment

Figure 2:
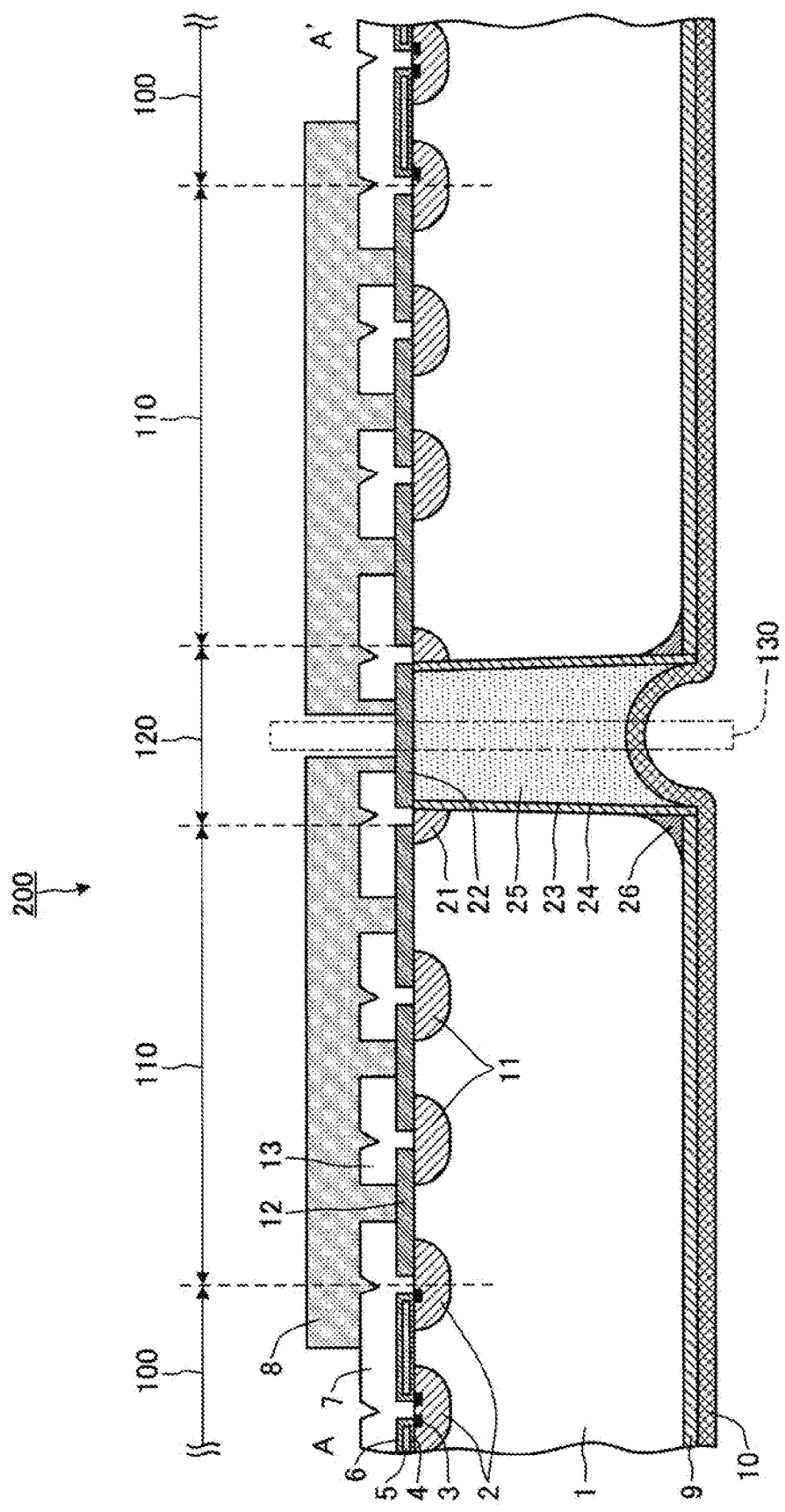
FIG. 2 is a cross sectional view along the line segment A-A' in FIG. 1.
Figure 3:
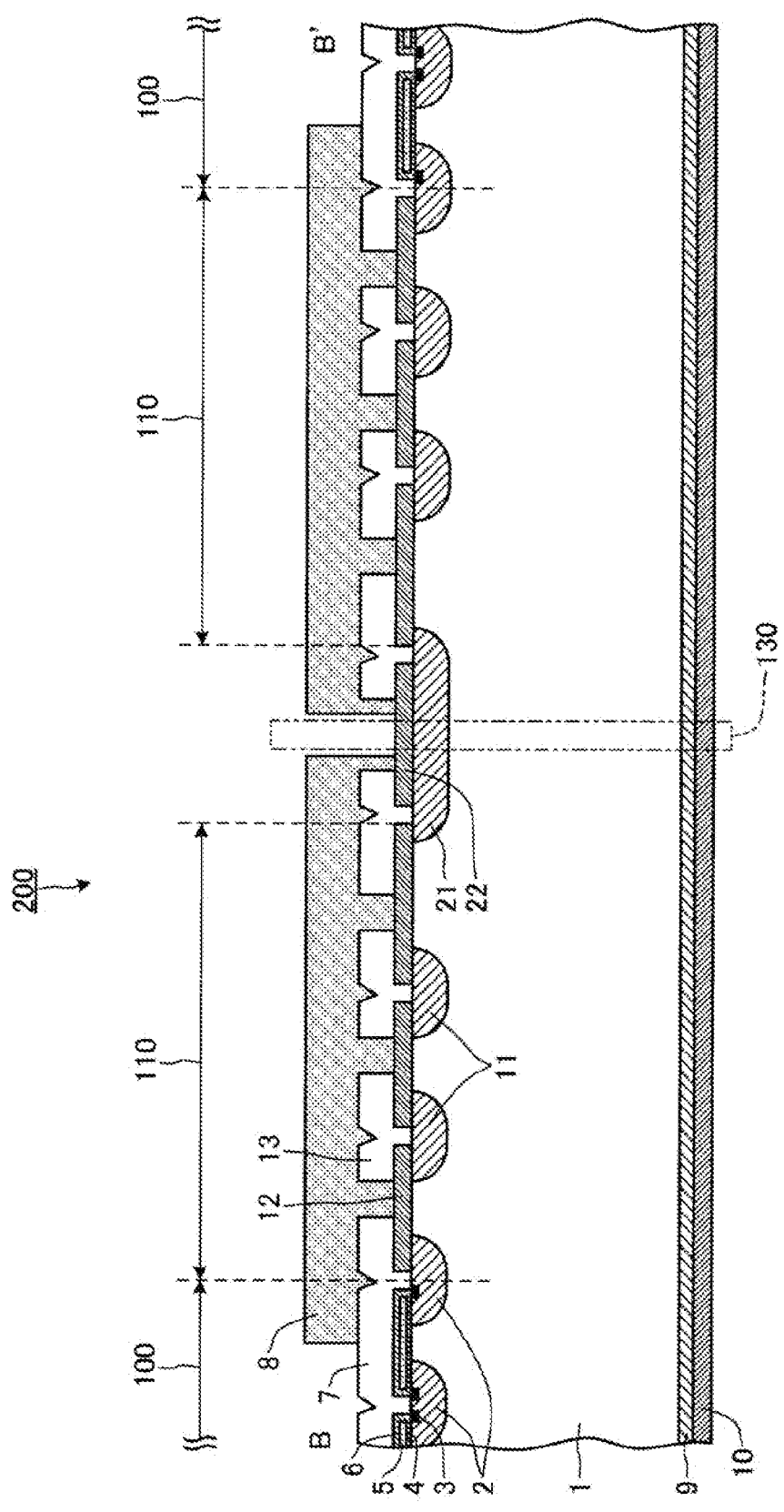
FIG. 3 is a cross sectional view along the line segment B-B' in FIG. 1.

The structure of a semiconductor device according to a first embodiment of the invention will be described first. FIG. 1 is a top plan view showing the structure of the semiconductor device according to the first embodiment. FIG. 2 is a cross sectional view along the line segment A-A' in FIG. 1. FIG. 3 is a cross sectional view along the line segment B-B' in FIG. 1. In FIG. 1, the detailed structures are not described to clearly illustrate active section 100, edge termination section 110 having a voltage blocking structure (hereinafter referred to simply as "edge termination section 110"), and separation section 120 having a device separation structure (hereinafter referred to simply as "separation section 120").

As shown in FIG. 1, semiconductor device 200 according to the first embodiment includes active section 100, edge termination section 110 around active section 100, and separation sections 120 scattered around edge termination section 110. Since separation sections 120 are disposed over region 130 which will be a dicing line, separation sections 120 will be exposed discontinuously to the chip outer edge after dicing.

As shown in FIGS. 2 and 3, p-type base regions 2 are formed selectively in the surface portions in active section 100 on the first major surface side of very resistive $n^-$-type silicon substrate 1 that will work for an $n^-$-type drift layer. In the surface portion of p-type base region 2, $n^+$-type emitter region 3 is formed selectively. Gate electrode 5 is formed above the extended portion of p-type base region 2 extended between $n^+$-type emitter region 3 and the $n^-$-type drift layer ($n^-$-type silicon substrate 1) and above the extended portion of the $n^-$-type drift layer extended between p-type base regions 2 with gate insulator film 4 interposed between gate electrode 5 and the extended portions. Emitter electrode 7 is connected to the portion of the first major surface, to which $n^+$-type emitter region 3 is exposed. Gate electrode 5 and emitter electrode 7 are separated from each other by insulator film 6. Passivation film 8 is formed on emitter electrode 7.

In the surface portion on the second major surface side of $n^-$-type silicon substrate 1, p-type collector layer 9 is disposed. Collector electrode 10 is formed on p-type collector layer 9. The depth of the pn-junction between p-type collector layer 9 and $n^-$-type silicon substrate 1 from the first major surface is approximately 200 μm for the reverse blocking IGBT of the 1200 V class and 100 μm for the reverse blocking IGBT of the 600 V class.

Outside active section 100, edge termination section 110 is formed as a kind of edge termination structure for the planar-type pn-junction surface. Edge termination section 110 is outside active section 100 in the first major surface. Edge termination section 110 includes several stages of a combination including a guard ring formed of p-type semiconductor region 11 in the surface portion of $n^-$-type silicon substrate 1 and shaped with a ring, insulator film 12, and a field plate formed of metal film 13.

Around edge termination section 110, separation sections 120 are disposed. In separation section 120, p-type channel stopper region 21 is formed in the surface portion of the first major surface. Insulator film 22 is disposed on p-type channel stopper region 21. Along the side wall of trench 23 formed from the second major surface, $p^+$-type separation region 24 is formed in contact with p-type channel stopper region 21 and p-type collector layer 9 on the second major surface side. Trench 23 is formed such that trench 23 is over region 130 which will be a dicing line and such that the side wall thereof is extended almost in perpendicular to the second major surface.

Insulators such as spin-on glass (hereinafter referred to as an "SOG"), borosilicate glass (hereinafter referred to as "BSG"), polysilazane, and polyimide are buried in trench 23 as infill 25. Semiconductor materials such as polysilicon and epitaxial silicon may be used for infill 25. When infill 25 is an insulator, a simple and convenient coating method such as spin-coating and spray-coating may be employed for burying infill 25 in trench 23, shortening the manufacturing time for the semiconductor device.

By the provision of separation section 120, the depletion layers that expand on both sides of the pn-junctions, when a reverse bias voltage is applied, are prevented from expanding to the cut plane caused by dicing and the damaged regions caused around the cut plane by dicing. Therefore, a sufficient reverse blocking voltage is obtained.

According to the first embodiment, a device structure is formed on the first major surface side and the back surface side is polished. Trench 23 is formed from the second major surface side and diffusion is conducted from the second major surface side to form p$^+$-type separation region 24. After forming p$^+$-type separation region 24, a p-type impurity such as boron is implanted from the second major surface side to form p-type collector layer 9. By the ion implantation, p$^+$-type separation region 24 is expanded into the boundary region between the side wall of trench 23 in the opening thereof on the second major surface side and the second major surface. Hereinafter, the expanded portion of p$^+$-type separation region 24 will be referred to as a "boundary portion"). Boundary portion 26 of p$^+$-type separation region 24 is wider than (or doped more heavily than) the other portion of p$^+$-type separation region 24 excluding boundary portion 26. Stress is liable to be applied to boundary portion 26 between the side wall of trench 23 in the opening thereof and the second major surface. Therefore, cracks and fissures may be caused in boundary portion 26 in the manufacturing steps after the trench formation. In the semiconductor device according to the first embodiment, portion 26 of p$^+$-type separation region 24, wider than (or doped more heavily than) the other portion of p$^+$-type separation region 24 excluding boundary portion 26, is formed in the boundary region between the side wall of trench 23 in the opening thereof and the second major surface. Therefore, the reverse blocking voltage will be prevented from decreasing, even if cracks and fissures are caused in the manufacturing steps.

Although trench 23 is formed in FIG. 2 such that trench 23 is bored through p-type channel stopper region 21, trench 23 may be formed in the other manner with no problem. Trench 23 may be formed such that the bottom of trench 23 is inside p-type channel stopper region 21 or such that the bottom of trench 23 is not positioned so deep as p-type channel stopper region 21. In other words, trench 23 may be formed such that p$^+$-type separation region 24 formed along the side wall of trench 23 is in contact with p-type channel stopper region 21.

Although separation sections 120 are formed discontinuously around edge termination section 110, separation sections 120 may be formed in the other manner with no problem. Alternatively, separations 120 may be formed continuously around edge termination section 110. In other words, separation section 120 may be formed such that separation section 120 surrounds edge termination section 110 entirely. In this structure, the chip edge area is occupied by separation section 120 entirely.

Second Embodiment

Figure 4:
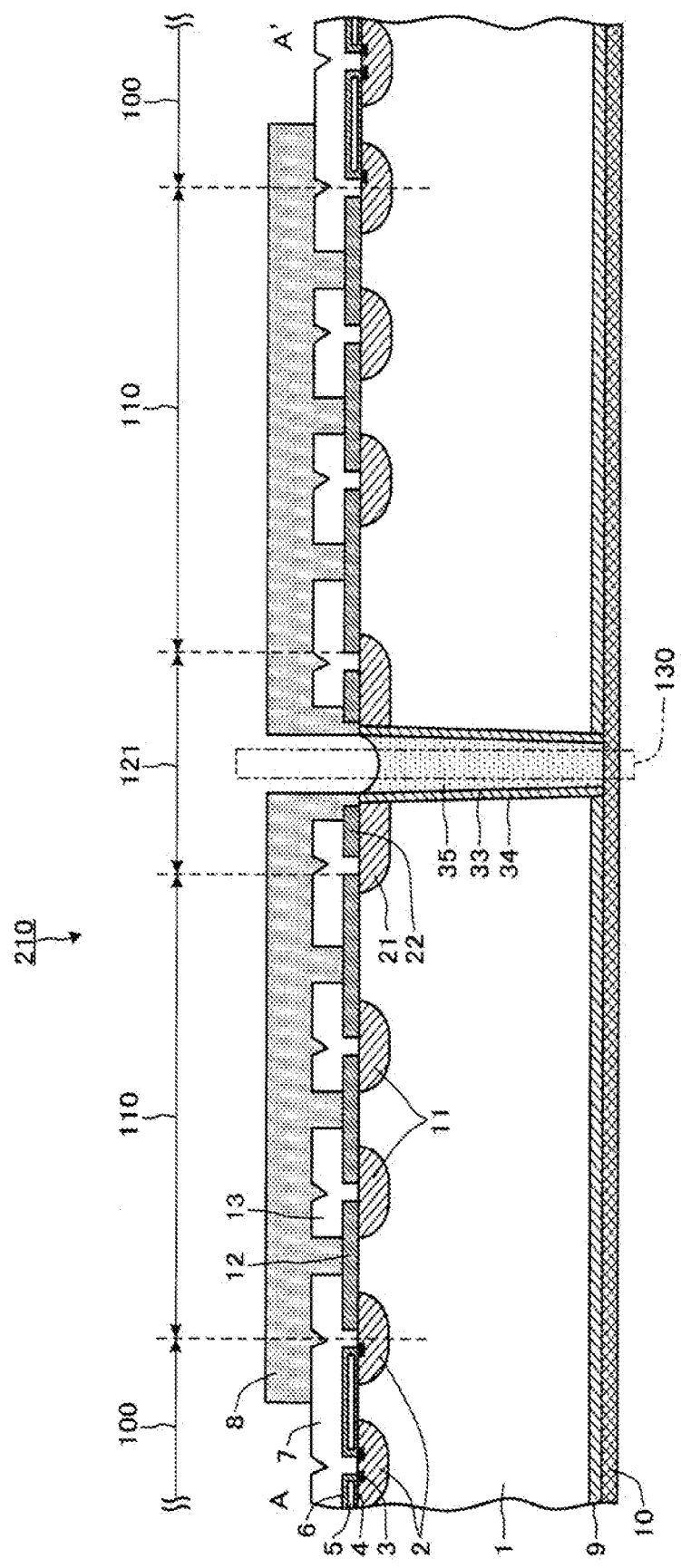
FIG. 4 is a cross sectional view showing the structure of a semiconductor device according to a second embodiment of the invention.

Now a semiconductor device according to a second embodiment of the invention will be described below. FIG. 4 is a cross sectional view of the semiconductor device according to the second embodiment.

Semiconductor device 210 according to the second embodiment is manufactured in the following way. A surface device structure is formed on the first major surface side of semiconductor substrate 1 and the back surface side of semiconductor substrate 1 is polished. Then, trench 33 is formed from the first major surface side. Impurity diffusion is conducted from the first major surface side to form p$^+$-type separation region 34. To make it easier to form p$^+$-type separation region 34, an insulator is buried in trench 33 for infill 35. Since the other structures are the same as those in semiconductor device 200 according to the first embodiment, their duplicated descriptions are omitted for the sake of simplicity.

Any portion of p$^+$-type separation region 34, wider than (or doped more heavily than) the other portion of p$^+$-type separation region 34, is not formed in the boundary region between the side wall of trench 33 in the opening thereof and the second major surface according to the second embodiment. However, the structure according to the second embodiment makes it possible to bury an insulator in trench 33.

Third Embodiment

Figure 5:
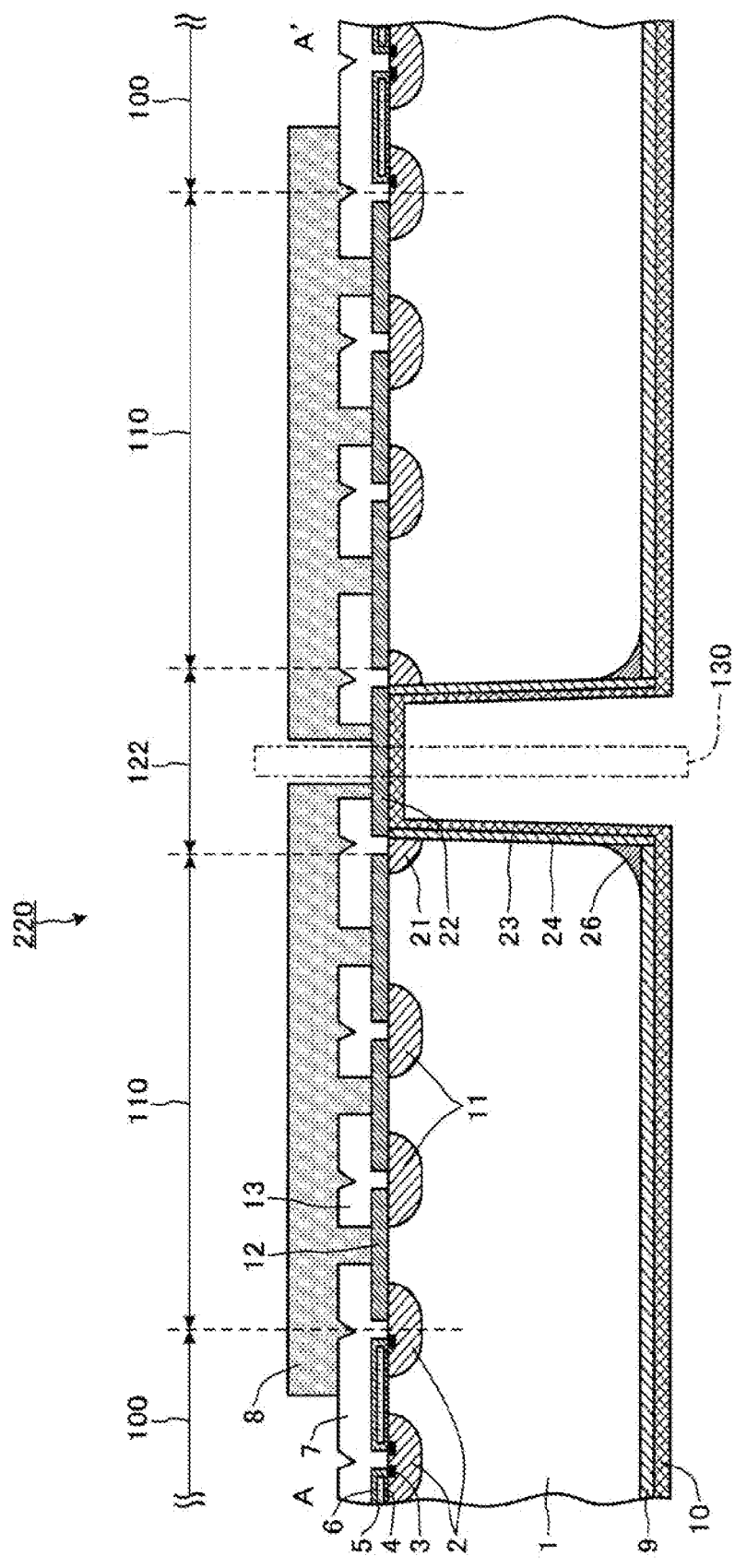
FIG. 5 is a cross sectional view showing the structure of a semiconductor device according to a third embodiment of the invention.

Now a semiconductor device according to a third embodiment of the invention will be described below. FIG. 5 is a cross sectional view of the semiconductor device according to the third embodiment.

As shown in FIG. 5, no insulator is not buried in trench 23 formed from the second major surface side in separation section 122 having a device separation structure (hereinafter referred to simply as "separation section 122") in semiconductor device 220 according to the third embodiment. Since the other structures are the same as those in semiconductor device 200 according to the first embodiment, their duplicated descriptions are omitted for the sake of simplicity.

The semiconductor device according to the third embodiment exhibits the same effects as the semiconductor device according to the first embodiment. Since the adjacent chips are connected to each other only with insulation film 22 and collector electrode 10, chips may be isolated from each other without dicing.

Fourth Embodiment

Figure 6:
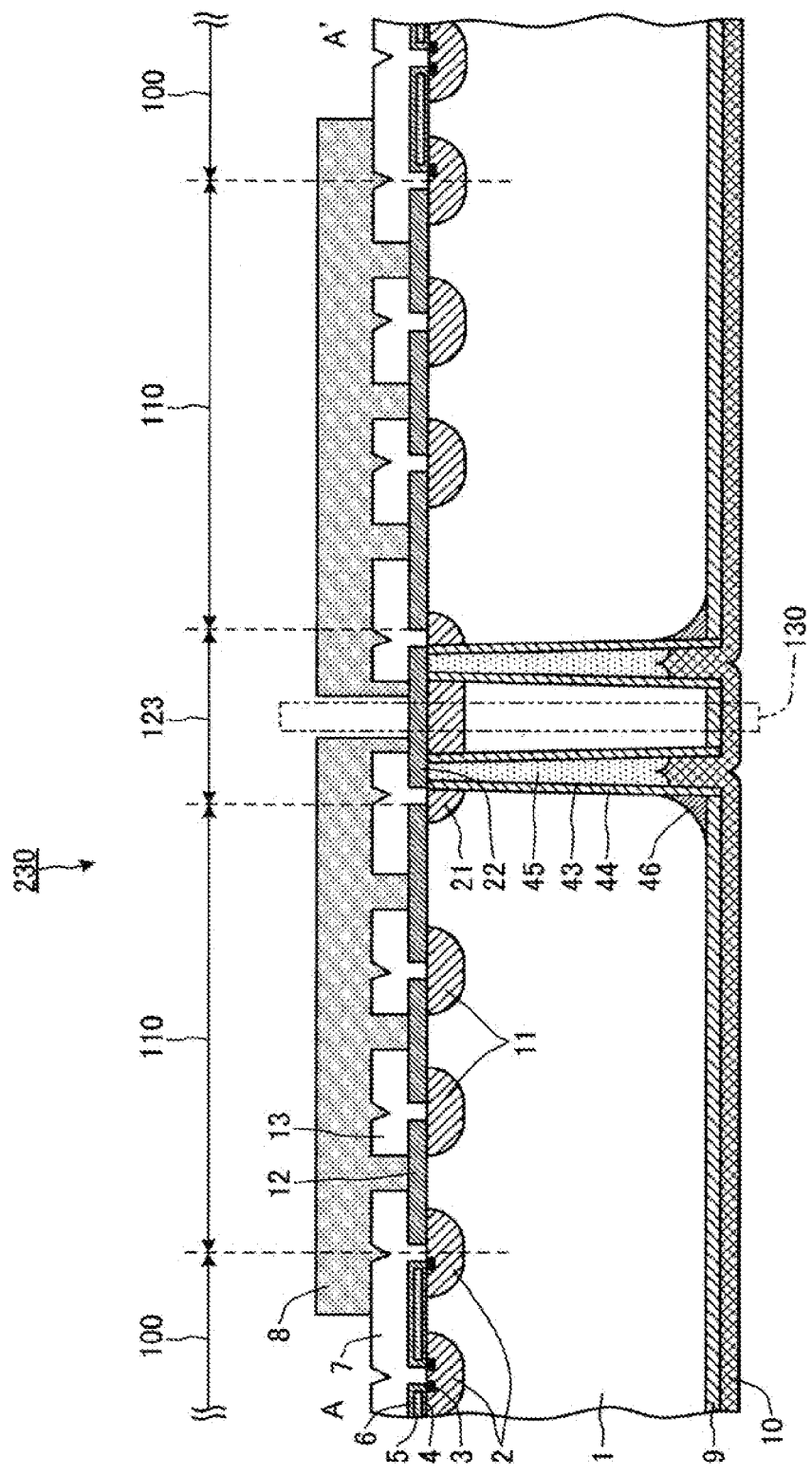
FIG. 6 is a cross sectional view showing the structure of a semiconductor device according to a fourth embodiment of the invention.

Now a semiconductor device according to a fourth embodiment of the invention will be described below. FIG. 6 is a cross sectional view of the semiconductor device according to the fourth embodiment.

As shown in FIG. 6, trench 43 formed in separation section 123 having a device separation structure (hereinafter referred to simply as "separation section 123") is not over region 130, which will be a dicing line, but is formed in every chip in semiconductor device 230 according to the fourth embodiment. In other words, trenches 43 are formed on both sides of region 130 which will be a dicing line such that trenches 43 are not in contact with region 130 in separation section 123.

Along the side wall of trench 43 formed from the second major surface side, p$^+$-type separation region 44 is formed. For forming p-type collector layer 9 in the surface portion on the second major surface side, a p-type impurity such as boron is implanted. As a result of the ion implantation, boundary portion 46, wider than (or doped more heavily than) the other portion of p$^+$-type separation region 44 excluding boundary portion 46, is formed in the boundary region between the side wall of trench 43 in the opening thereof on the second major surface side and the second major surface according to the fourth embodiment. For infill 45, an insulator, for example, is buried in trench 43. Since the other structures are the same as those in the semiconductor device according to the first embodiment, their duplicated descriptions are omitted for the sake of simplicity.

The semiconductor device according to the fourth embodiment exhibits the same effects as the semiconductor device according to the first embodiment. Since trench 43 is not on the dicing line, dicing may be conducted with a conventional dicing machine.

Fifth Embodiment

Figure 7:
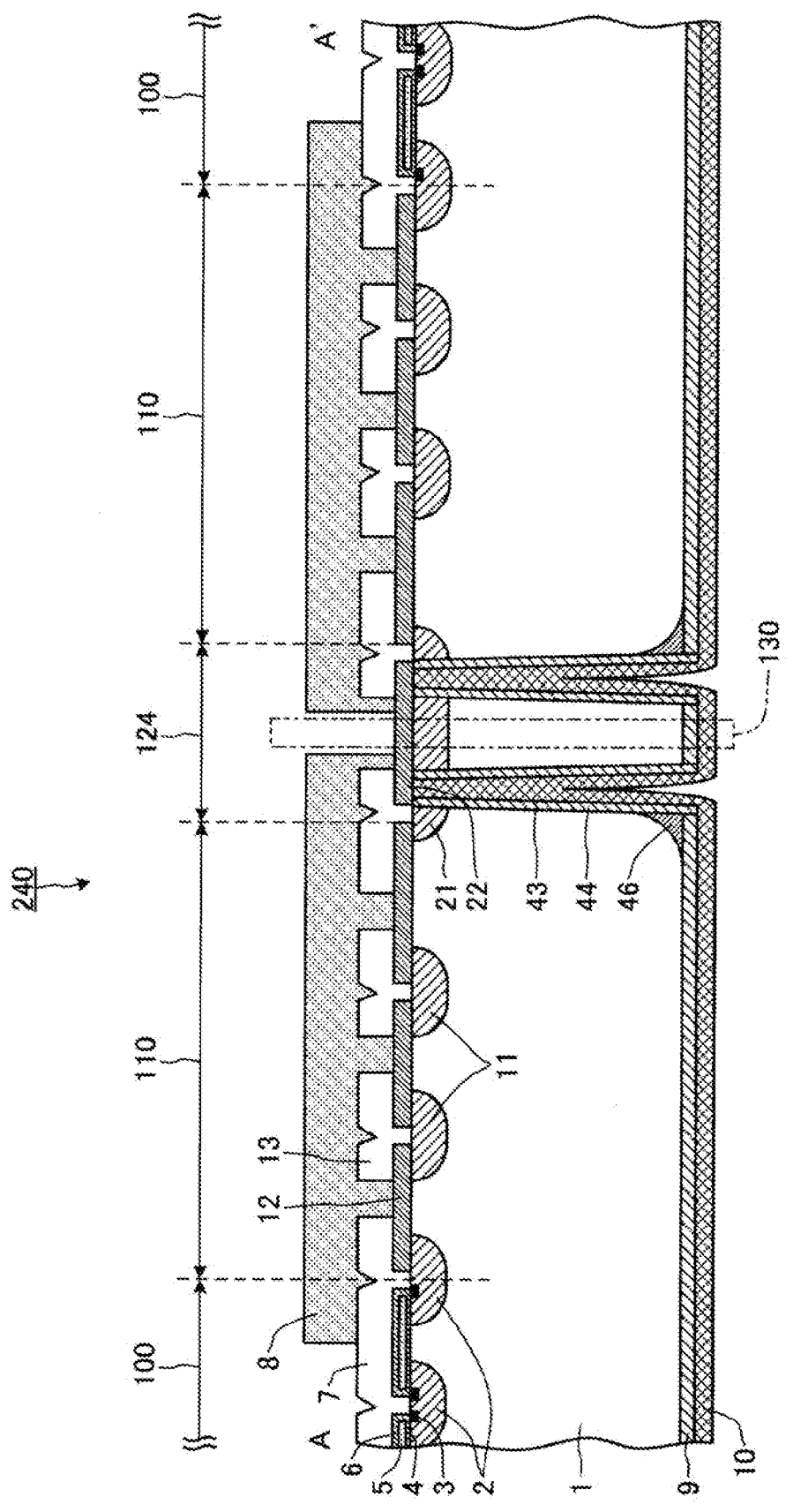
FIG. 7 is a cross sectional view showing the structure of a semiconductor device according to a fifth embodiment of the invention.

Now a semiconductor device according to a fifth embodiment of the invention will be described below. FIG. 7 is a cross sectional view of the semiconductor device according to the fifth embodiment.

As shown in FIG. 7, any infill is not buried in trench 43 formed in separation section 124 having a device separation structure in semiconductor device 240 according to the fifth embodiment. Since the other structures are the same as those in the semiconductor device according to the fourth embodiment, their duplicated descriptions are omitted for the sake of simplicity.

The semiconductor device according to the fifth embodiment exhibits the same effects as the semiconductor device according to the fourth embodiment.

Sixth Embodiment

Figure 8:
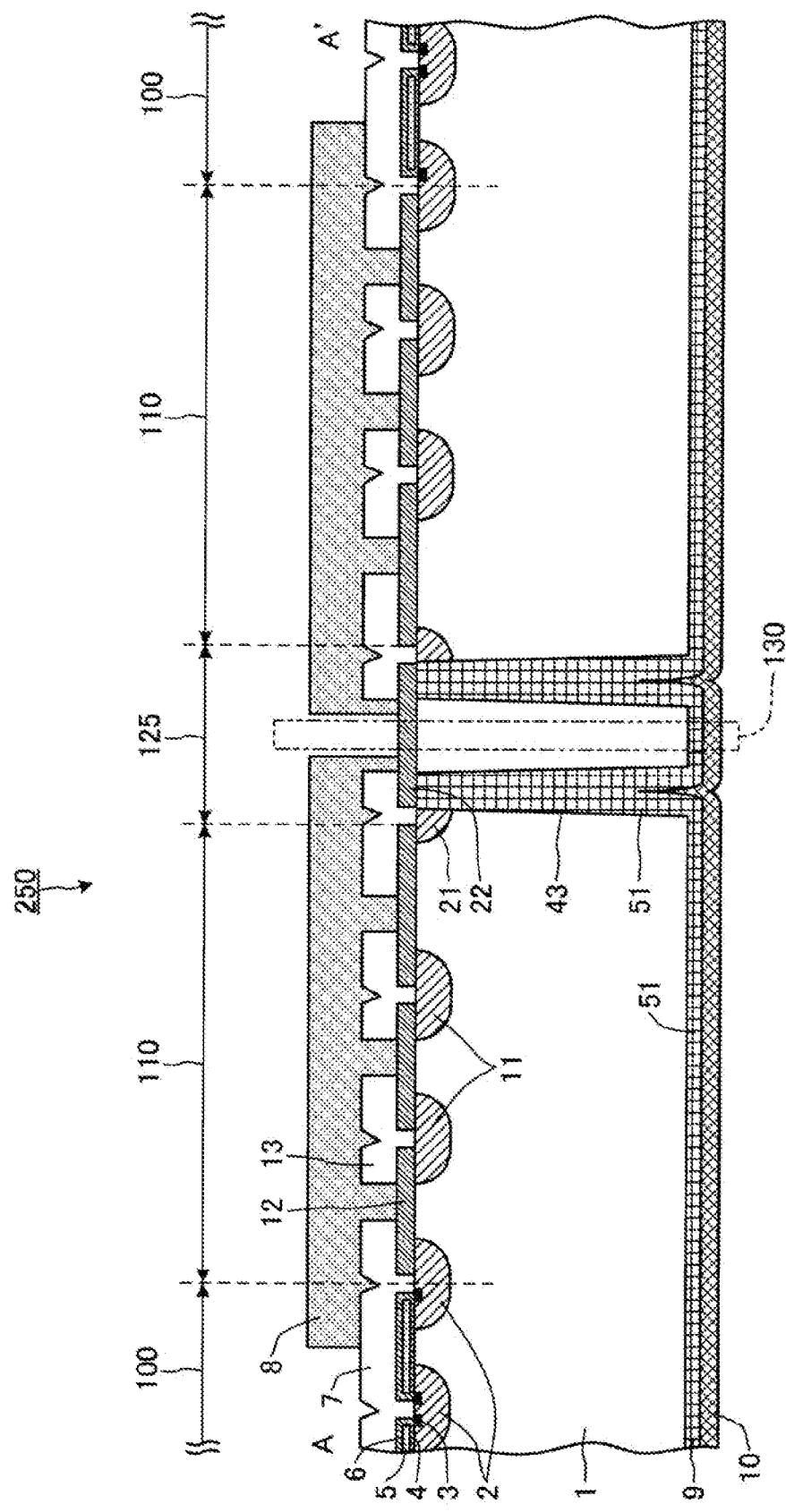
FIG. 8 is a cross sectional view showing the structure of a semiconductor device according to a sixth embodiment of the invention.

Now a semiconductor device according to a sixth embodiment of the invention will be described below. FIG. 8 is a cross sectional view of the semiconductor device according to the sixth embodiment.

As shown in FIG. 8, p-type epitaxial layer 51 is formed in the surface portion on the second major surface side of semiconductor device 250 and buried also in trench 43 in separation section 125 having a device separation structure according to the sixth embodiment. The p-type epitaxial layer 51 is formed by epitaxially growing the surface portion of the second major surface and the side wall of trench 43. In active section 100, p-type epitaxial layer 51 serves as a p-type collector layer.

Seventh Embodiment

Figure 9:
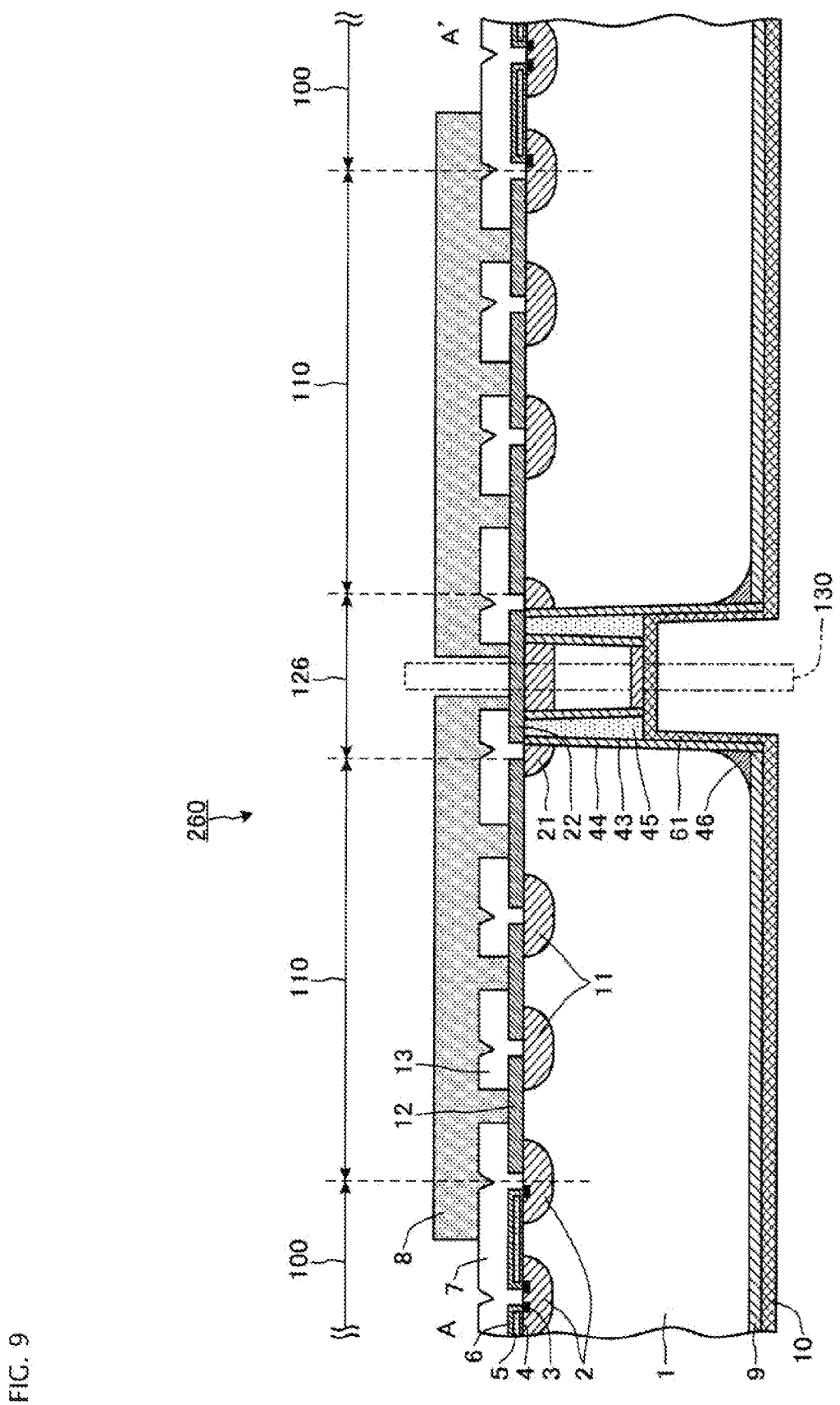
FIG. 9 is a cross sectional view showing the structure of a semiconductor device according to a seventh embodiment of the invention.

Now a semiconductor device according to a seventh embodiment of the invention will be described below. FIG. 9 is a cross sectional view of the semiconductor device according to the seventh embodiment.

As shown in FIG. 9, semiconductor device 260 according to the seventh embodiment applies the specific structure of the semiconductor device according to the third embodiment to the semiconductor device according to the fourth embodiment. In detail, first trenches 43 are formed on both sides of region 130, which will be a dicing line, in separation section 126 having a device separation structure. In other words, first trench 43 is formed in every chip. Further, second trench 61, the depth of which from the second major surface is shorter than the depth of first trench 43 from the second major surface, is formed. Second trench 61 is formed over region 130 which will be a dicing line. Second trench 61 connects two trenches 43 over region 130. Boundary portion 46 of $p^+$-type separation region 44, wider than (or doped more heavily than) the other portion of $p^+$-type separation region 44 excluding boundary portion 46, is formed in the boundary region between the side wall of second trench 61 in the opening thereof on the second major surface side and the second major surface.

The semiconductor device according to the seventh embodiment exhibits the same effects as the semiconductor device according to the first embodiment. If the BSG buried in the trench as an infill is hollowed out while the BSG coated on the second major surface is etched in the manufacturing process, the scooped BSG surface will not be exposed. Therefore, solder voids will be prevented from occurring after the soldering conducted in the module assembly.

Eighth Embodiment

Figure 10:
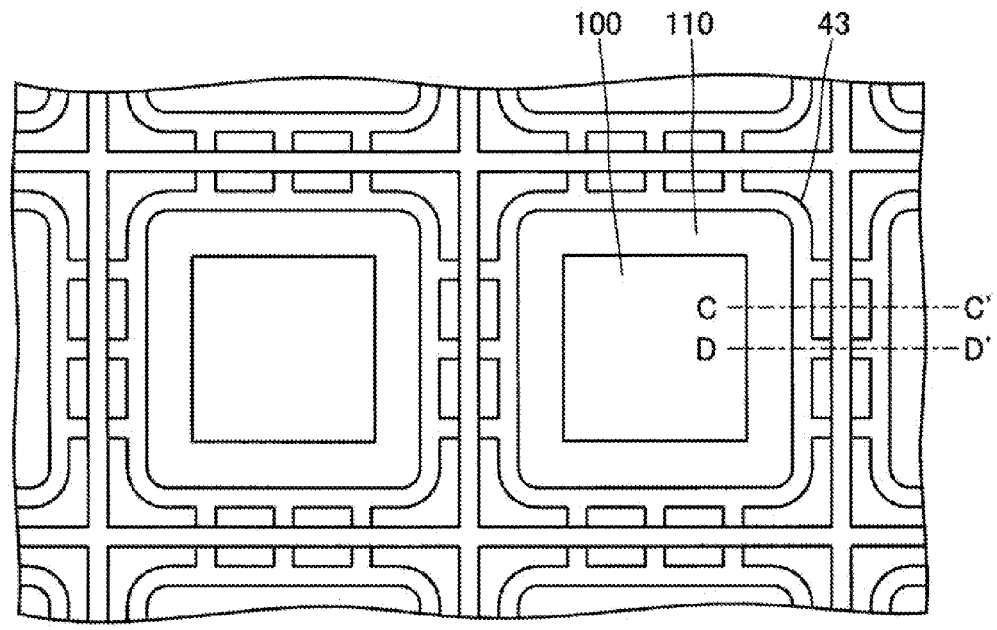
FIG. 10 is a top plan view showing the structure of a semiconductor device according to an eighth embodiment of the invention.

Now a semiconductor device according to an eighth embodiment of the invention will be described below. FIG. 10 is a top plan view of the semiconductor device according to the eighth embodiment.

As shown in FIG. 10, the semiconductor device according to the eighth embodiment has a cross sectional structure along the line segment C-C', in which trenches 43 are formed in the separation section on both sides of the region, which will be a dicing line, in the same manner as in the semiconductor device according to the fourth or fifth embodiment. In other words, trench 43 is formed in every chip. In the cross sectional structure along the line segment D-D', a trench is formed over the dicing line in the same manner as in the semiconductor device according to the third or seventh embodiment.

The semiconductor device according to the eighth embodiment exhibits the same effects as the semiconductor device according to the fourth embodiment. Since air bypasses are extended to the chip outer edge, solder voids are prevented from occurring.

Ninth Embodiment

Figure 11:
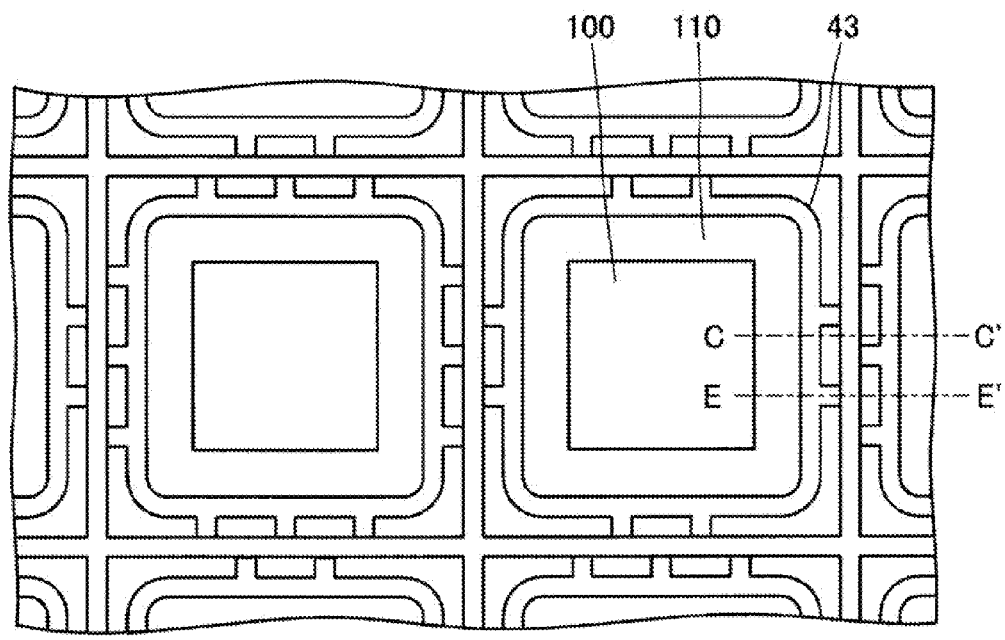
FIG. 11 is a top plan view showing the structure of a semiconductor device according to a ninth embodiment of the invention.

Now a semiconductor device according to a ninth embodiment of the invention will be described below. FIG. 11 is a top plan view of the semiconductor device according to the ninth embodiment.

As shown in FIG. 11, the semiconductor device according to the ninth embodiment has a cross sectional structure along the line segment E-E', in which trenches 43 are formed in the separation section on both sides of the region, which will be a dicing line, in the same manner as in the semiconductor device according to the fourth or fifth embodiment. In other words, trench 43 is formed in every chip. Moreover, branch trenches are extended from trench 43 on either side to the region, which will be a dicing line.

The semiconductor device according to the ninth embodiment exhibits the same effects as the semiconductor device according to the eighth embodiment.

Tenth Embodiment

Now a method for manufacturing a semiconductor device according to a tenth embodiment of the invention will be described below with reference to FIGS. 12 through 19. The method for manufacturing a semiconductor device according to the tenth embodiment is a method for manufacturing semiconductor device 200 shown in FIG. 2. FIGS. 12 through 19 are cross sectional views describing the steps for manufacturing the semiconductor device shown in FIG. 2.

Figure 12:
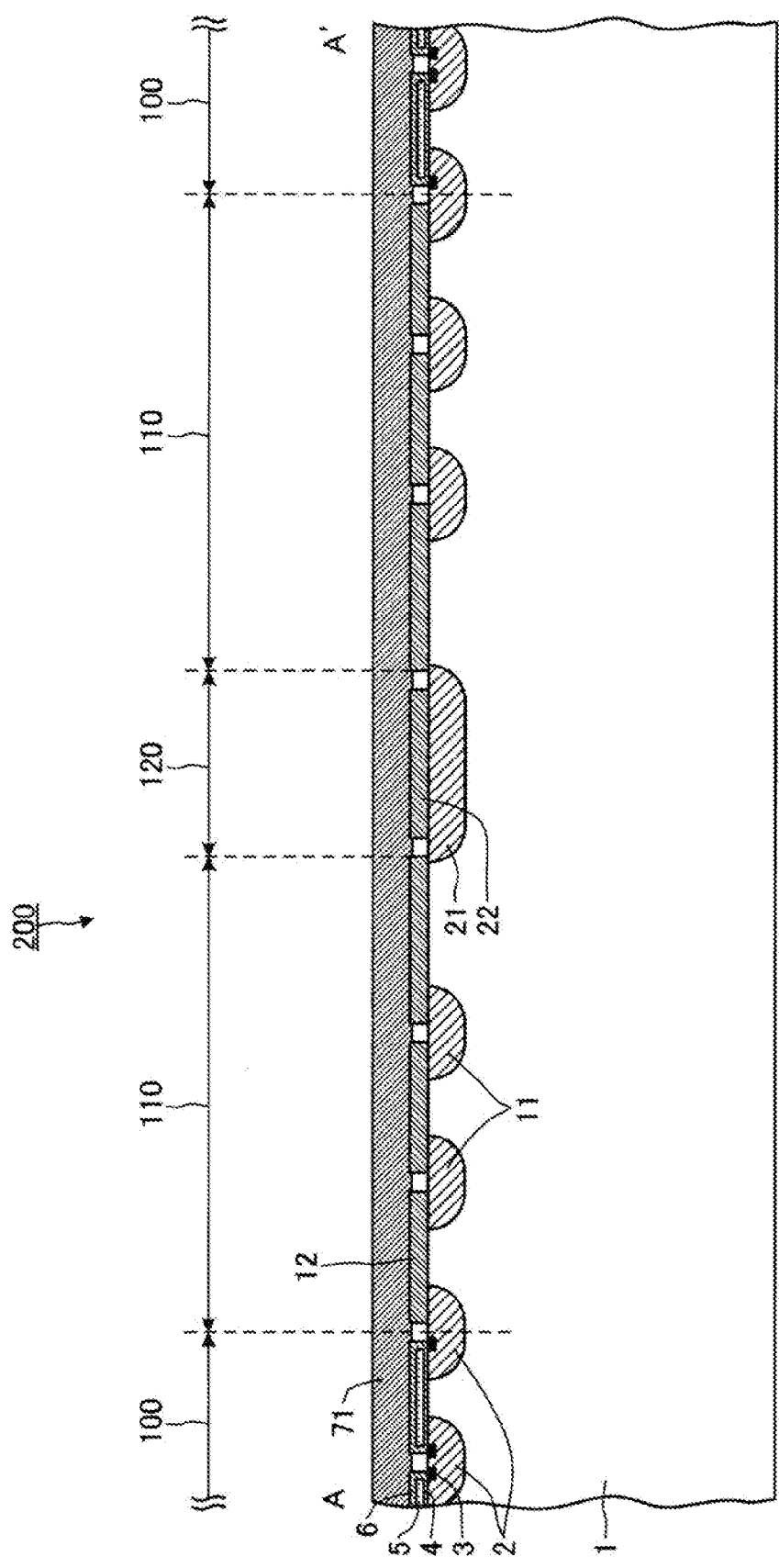
FIG. 12 is a cross sectional view describing an early step for manufacturing the semiconductor device shown in FIG. 2.

Referring first to FIG. 12, a surface device structure is formed on the first major surface side of $n^-$-type silicon semiconductor substrate 1. The surface device structure includes p-type base region 2, p-type semiconductor region 11 and p-type channel stopper region 21, which are formed selectively in the surface portions on the first major surface side of $n^-$-type silicon semiconductor substrate 1. In the surface portion of p-type base region 2, n+-type emitter region 3 is formed selectively. Gate electrode 5 is formed above the extended portion of p-type base region 2 extended between n+-type emitter region 3 and an n−-type drift layer (n−-type silicon semiconductor substrate 1) and above the extended portion of the n−-type drift layer extended between p-type base regions 2. Gate insulator film 4 is interposed between gate electrode 5 and the extended portions. Gate electrode 5 is covered with insulator film 6.

Insulator film 12 is formed on the extended portion of the n−-type drift layer extended between p-type semiconductor region 11 and p-type channel stopper region 21. Insulator film 12 is formed also on the extended portion of the n−-type drift layer extended between p-type semiconductor regions 11. Insulator film 22 is formed on p-type channel stopper region 21. Insulator films 6, 12 and 22 are formed by forming an insulator film on the entire first major surface of n−-type silicon semiconductor substrate 1 and by pattering the insulator film. Then, first reinforcing plate 71 is bonded onto insulator films 6, 12 and 22 with an adhesive, for example.

Figure 13:
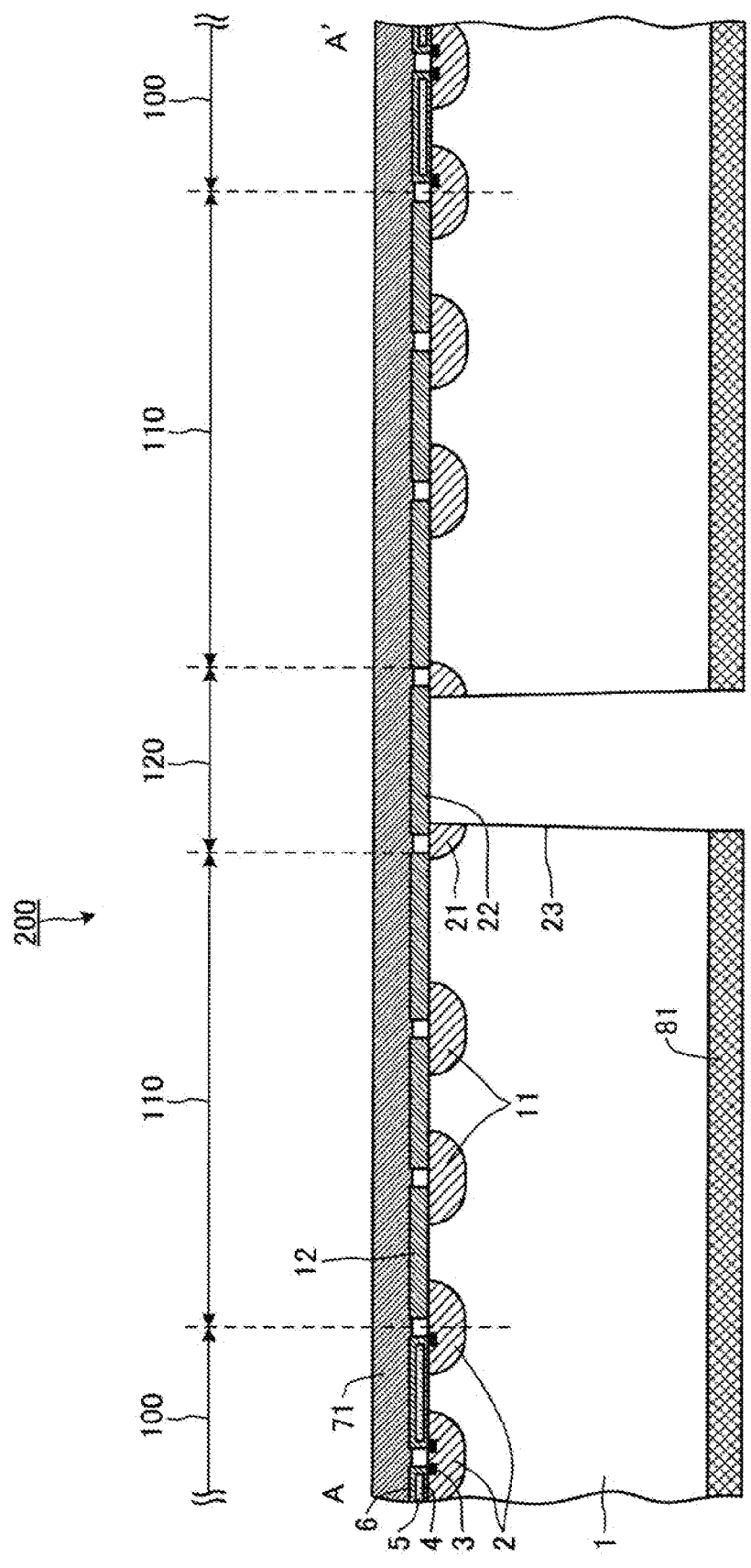
FIG. 13 is a cross sectional view describing a subsequent step, subsequent to the step described in FIG. 12, for manufacturing the semiconductor device shown in FIG. 2.

Referring now to FIG. 13, n−-type silicon semiconductor substrate 1 is polished from the second major surface side (back surface side) until a desired substrate thickness is obtained. In detail, n−-type silicon semiconductor substrate 1 is polished to be approximately 200 μm in thickness for manufacturing a reverse blocking IGBT of the 1200 V class. For manufacturing a reverse blocking IGBT of the 600 V class, n−-type silicon semiconductor substrate 1 is polished to be approximately 100 μm in thickness. Then, a mask film formed of a silicon oxide film, a silicon nitride film, a resist film, a metal film, or a combined film combining these films appropriately is formed on the entire second major surface polished.

Then, the mask film is patterned and etched to form etching mask 81 having an opening over region 130 which will be a dicing line. Then, etching is conducted from the second major surface side to form trench 23 extending as far as p-type channel stopper region 21. Insulator film 22 may be employed for an etching stopper in forming trench 23. In other words, trench 23 may extend through p-type channel stopper region 21 with no problem. Trench 23 may not be so deep as to reach p-type channel stopper region 21 as far as p+-type separation region 24 formed along the side wall of trench 23 is connected electrically to p-type channel stopper region 21. It is not always necessary to form trench 23 by etching. Alternatively, trench 23 may be formed by mechanical machining such as blade dicing or by abrasion machining such as laser beam irradiation. If mechanical machining or abrasion machining is employed, the manufacturing process will be simple and easy, since neither an etching mask formation nor a photo-process is necessary.

Figure 14:
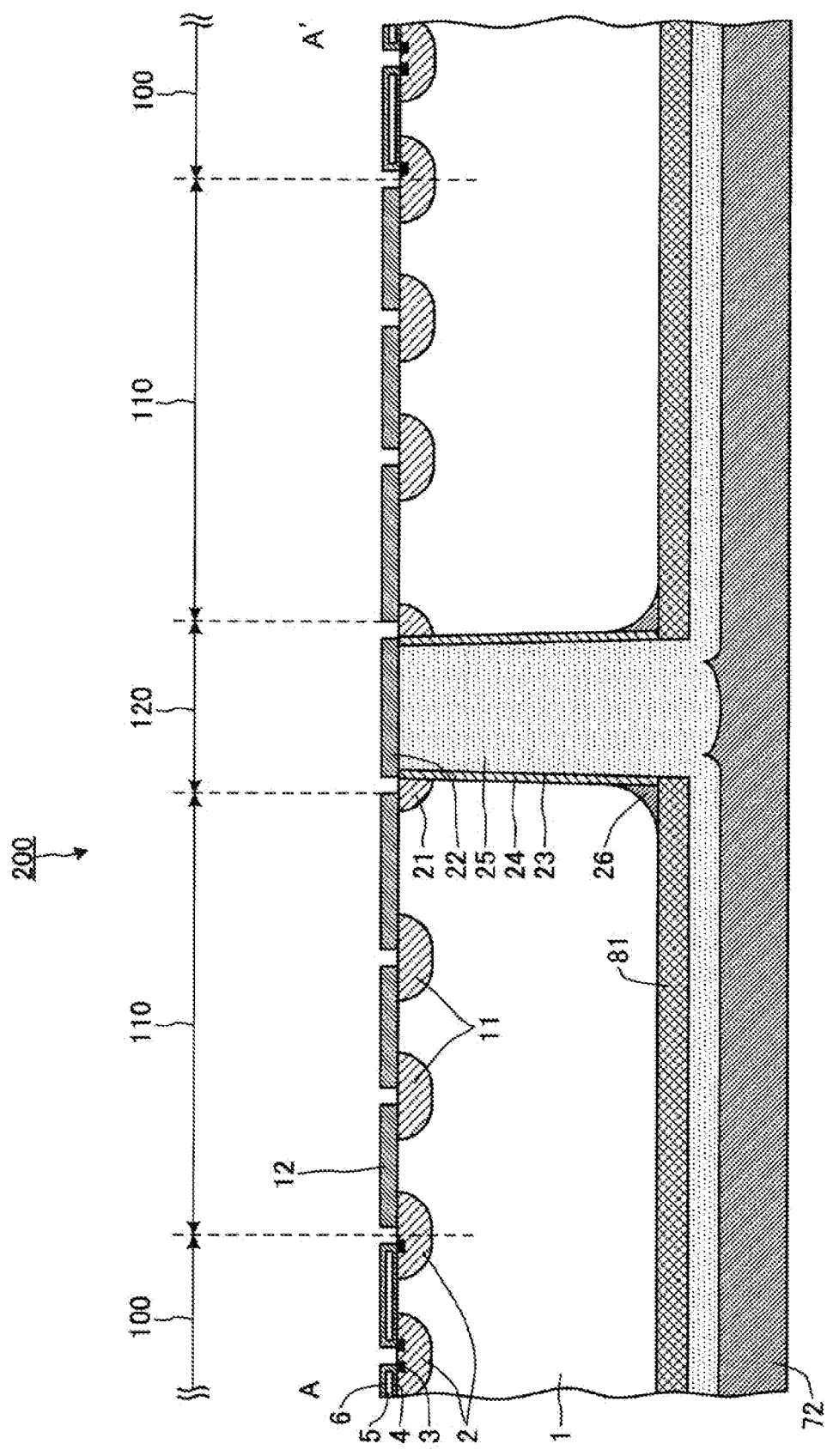
FIG. 14 is a cross sectional view describing a subsequent step, subsequent to the step described in FIG. 13, for manufacturing the semiconductor device shown in FIG. 2.

Referring now to FIG. 14, BSG is coated on the entire second major surface. BSG is buried in trench 23 for infill 25. A thermal treatment is conducted in a furnace at 900° C. to diffuse boron atoms from the BSG to form p+-type separation region 24 along the side wall of trench 23. Alternatively, p+-type separation region 24 may be formed by implanting boron ions and thermally treating the implanted boron atoms. Since no surface electrode has yet been formed on the first major surface in FIG. 14, the temperature inside the furnace may be raised as high as 900° C. in the thermal treatment.

Then, second reinforcing plate 72 is bonded onto the second major surface side with an adhesive, for example. It will not be necessary to bond reinforcing plate 72 if a sufficient strength is obtained by coating BSG. Then, first reinforcing plate 71 is peeled off.

Figure 15:
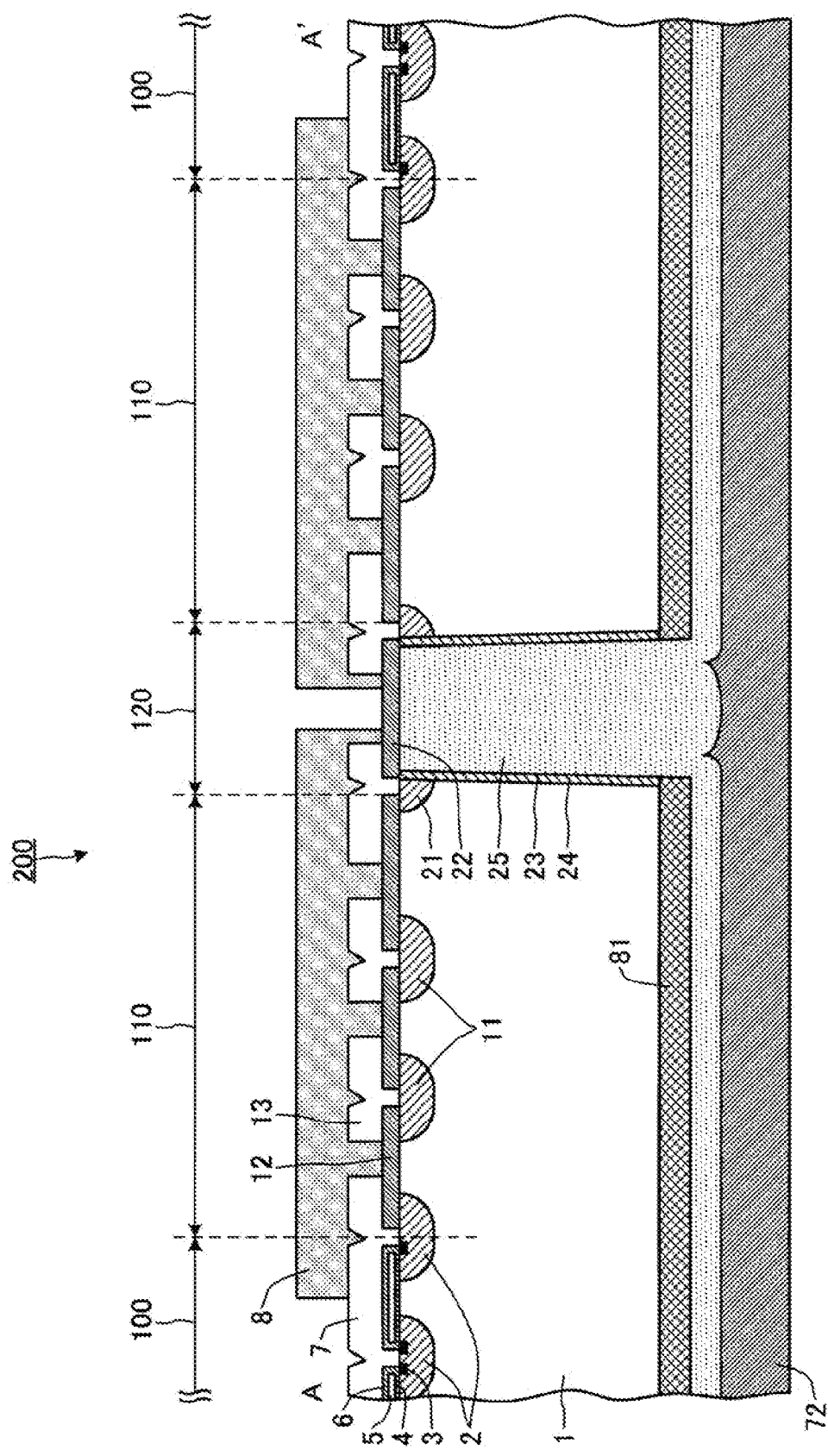
FIG. 15 is a cross sectional view describing a subsequent step, subsequent to the step described in FIG. 14, for manufacturing the semiconductor device shown in FIG. 2.

Referring now to FIG. 15, a metal film is formed on the entire first major surface by sputtering and the metal film is patterned to form emitter electrode 7 and metal film 13. Passivation film 8 is formed on the first major surface side and patterned.

Figure 16:
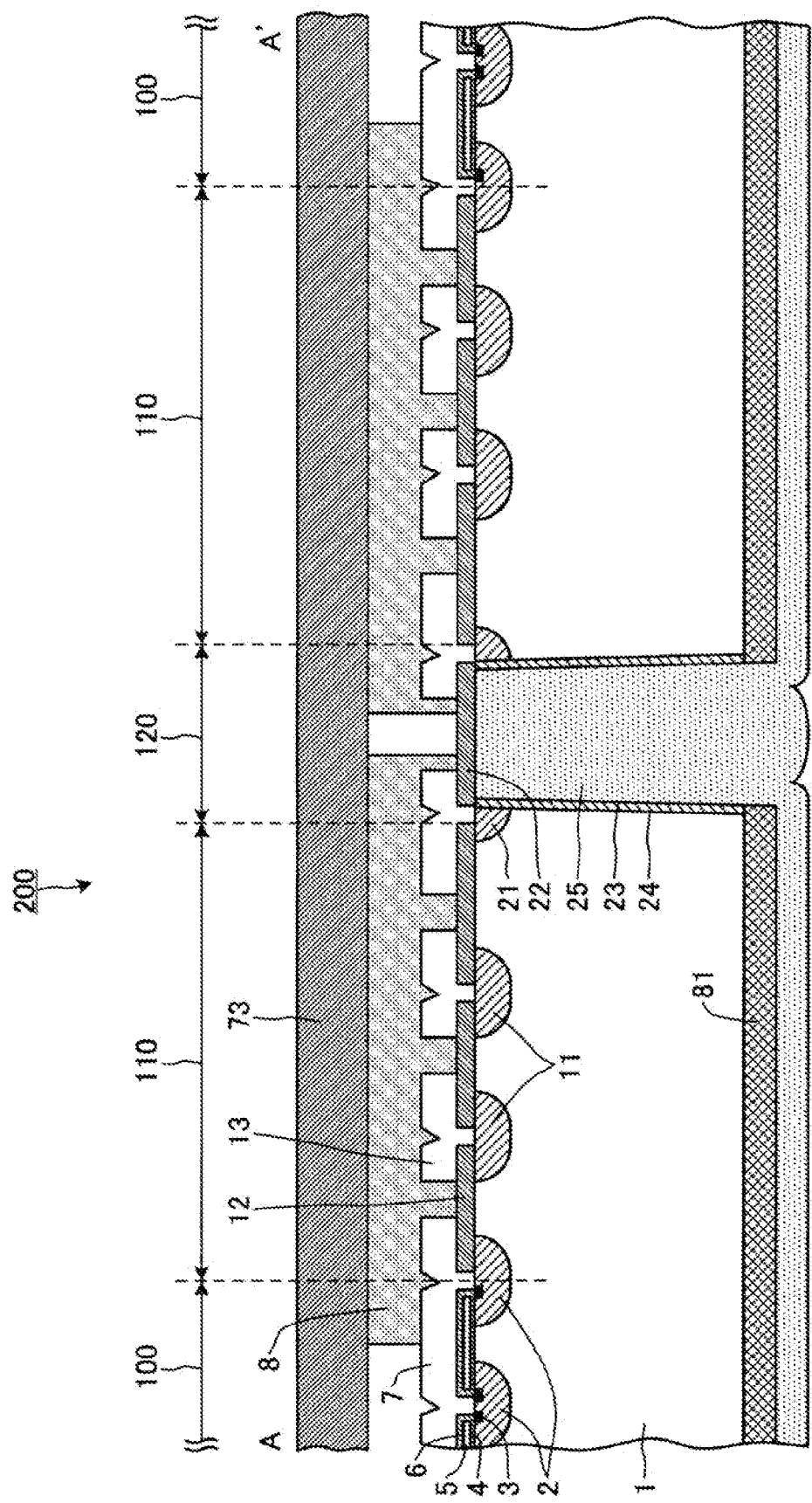
FIG. 16 is a cross sectional view describing a subsequent step, subsequent to the step described in FIG. 15, for manufacturing the semiconductor device shown in FIG. 2.

Referring now to FIG. 16, second reinforcing plate 72 will be peeled off, if second reinforcing plate 72 is on the substrate. Then, third reinforcing plate 73 is bonded onto the first major surface side. It will not be necessary to bond third reinforcing plate 73, if a sufficient strength is obtained by coating BSG in FIG. 14.

Figure 17:
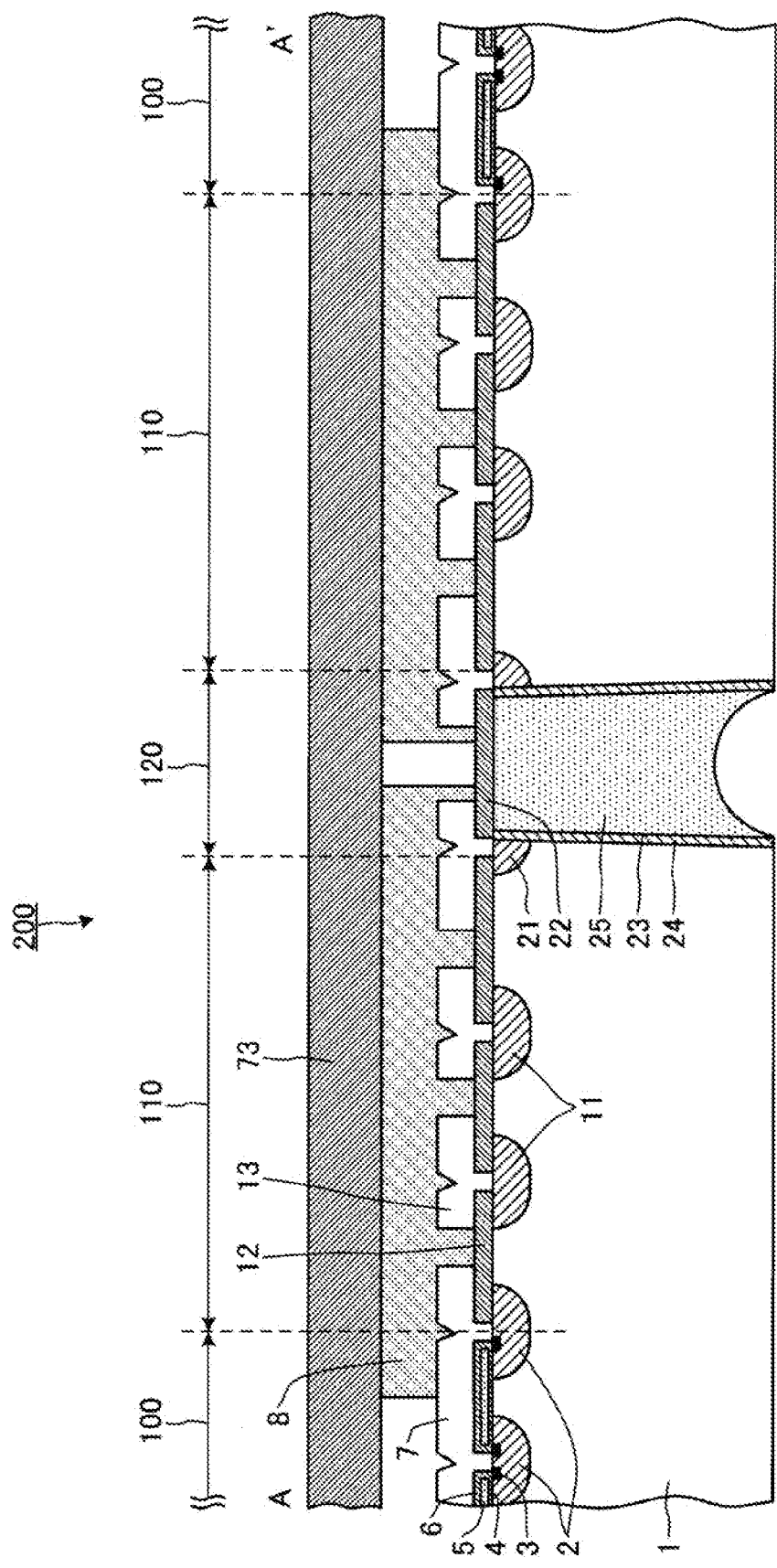
FIG. 17 is a cross sectional view describing a subsequent step, subsequent to the step described in FIG. 16, for manufacturing the semiconductor device shown in FIG. 2.

Referring now to FIG. 17, the BSG on the second major surface and etching mask 81 are etched.

Figure 18:
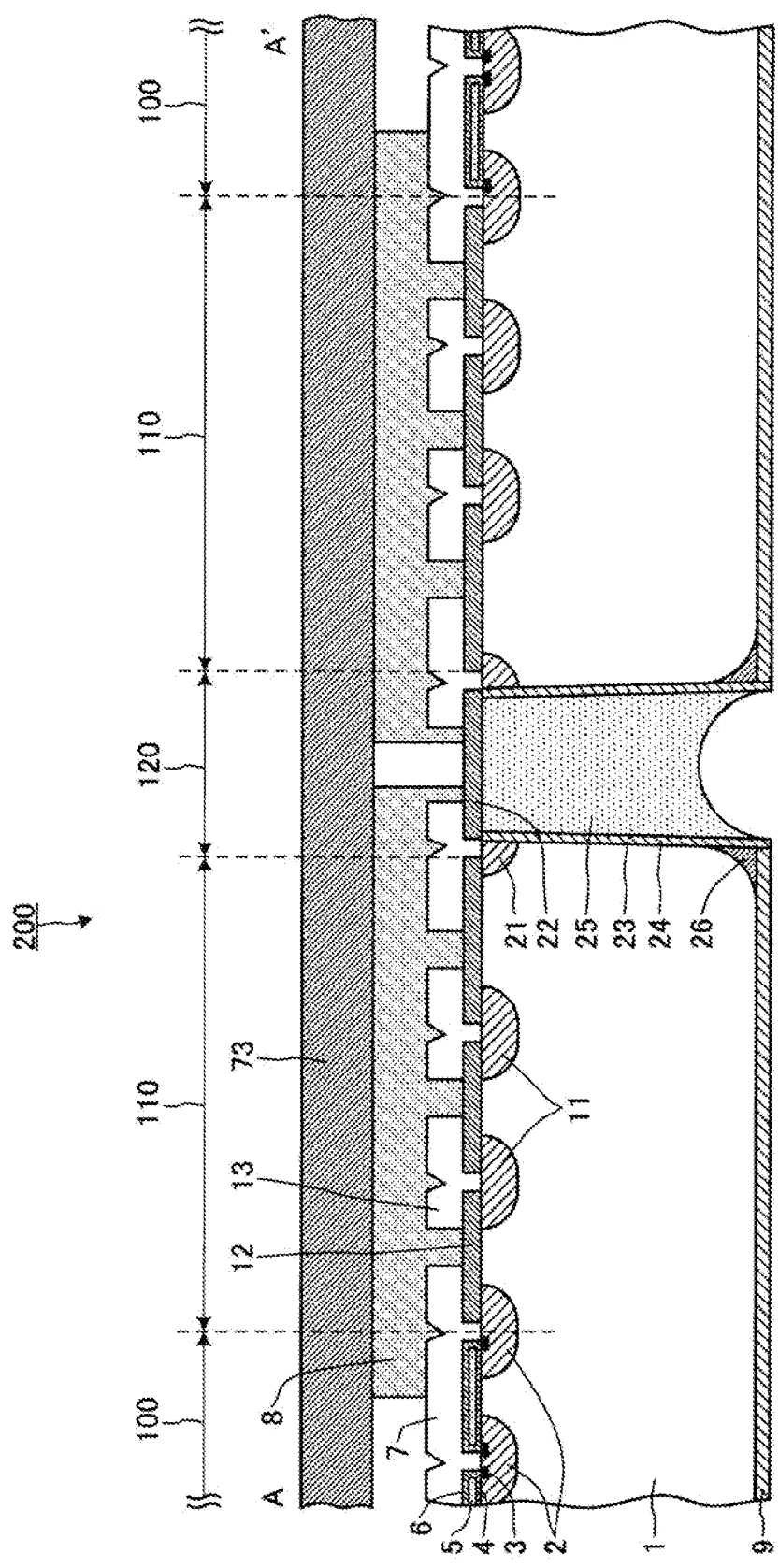
FIG. 18 is a cross sectional view describing a subsequent step, subsequent to the step described in FIG. 17, for manufacturing the semiconductor device shown in FIG. 2.

Referring now to FIG. 18, boron ions are implanted from the second major surface side and the implanted boron atoms are activated thermally to form p-type collector layer 9. Although p-type collector layer 9 is formed also in the boundary region between the side wall of trench 23 in the opening thereof and the second major surface, p+-type separation region 43 has been formed already in the boundary region by BSG diffusion. Therefore, boundary portion 26 of p+-type separation region 24 between the side wall of trench 23 in the opening thereof and the second major surface will be wider than (or doped more heavily than) the other portion of p+-type separation region 24 excluding boundary portion 26.

Figure 19:
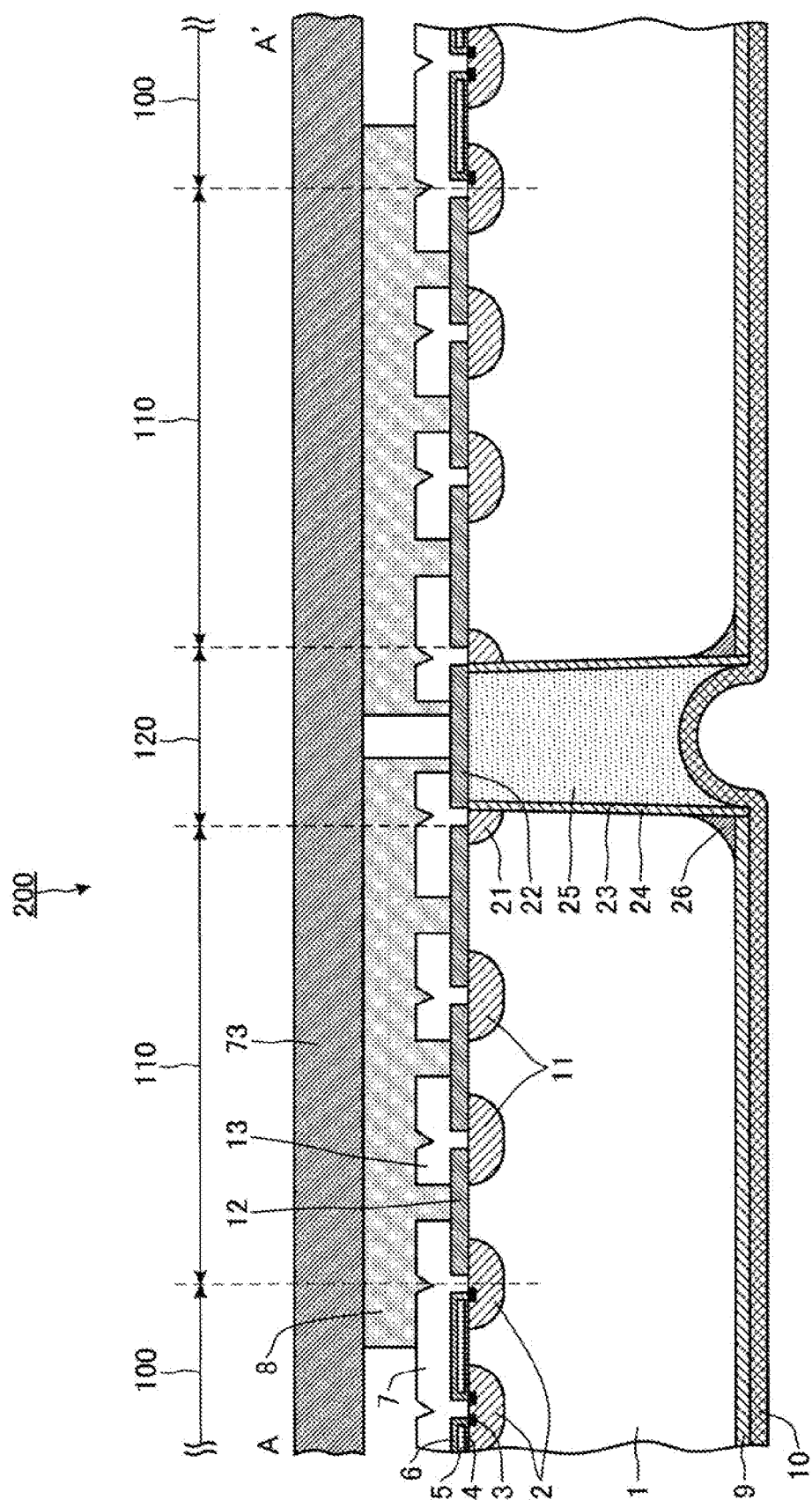
FIG. 19 is a cross sectional view describing a subsequent step, subsequent to the step described in FIG. 18, for manufacturing the semiconductor device shown in FIG. 2.

Referring now to FIG. 19, collector electrode 10 is formed on the second major surface side. Third reinforcing plate 73 bonded is peeled off. Then, dicing is conducted on region 130 which will be a dicing line. Thus, semiconductor device 200 is completed.

According to the tenth embodiment, only a trench is formed in the separation section between chips. Therefore, it is easy to wash the inside of the trench after the trench is formed. Since it is relatively easy to bury an infill in the trench or to implant ions into the trench side wall, the step of forming p+-type separation region 24 is simplified and the throughput is improved.

Since the surface device structure is formed first, then a trench is formed and, finally, an infill is buried in the trench, the infill will be prevented from being etched, even if the infill is an insulator. Since it is easier to bury an insulator in a trench than to bury a semiconductor in the trench, the manufacturing time for the semiconductor device is shortened.

In forming p-type collector layer 9 on the second major surface after forming a p+-type separation region on the trench side wall, a p-type region also is formed in the boundary region between the side wall of the trench in the opening thereof and the second major surface. Therefore, the portion of the p+-type separation region in the boundary region between the side wall of the trench in the opening thereof and the second major surface is widened or doped more heavily. Therefore, the reverse blocking voltage will be prevented from decreasing, even if cracks and fissures are caused in the boundary region between the side wall of the trench in the opening thereof and the second major surface.

Eleventh Embodiment

Now a method for manufacturing a semiconductor device according to an eleventh embodiment of the invention will be described below. The method for manufacturing a semiconductor device according to the eleventh embodiment is a method for manufacturing semiconductor device 210 shown in FIG. 4.

By the manufacturing method according to the eleventh embodiment, first reinforcing plate 71 is peeled off after the second major surface is polished by the manufacturing method according to the tenth embodiment (cf. FIG. 13). Then, the second reinforcing plate is bonded onto the second major surface side and a mask film is formed on the first major surface. Then, the mask film is patterned and etched to form etching mask 81 having an opening over region 130 which will be a dicing line on the first major surface side. Then, etching is conducted from the first major surface side to form trench 23. Trench 23 may be deep enough to extend through n⁻-type silicon semiconductor substrate 1. Alternatively, trench 23 may not be so deep as to extend through n⁻-type silicon semiconductor substrate 1 as far as p⁺-type separation region 24 formed later is connected electrically to p-type collector layer 9.

Then, first reinforcing plate 71 is bonded again onto the first major surface side and the second reinforcing plate is peeled off as shown in FIG. 13. Subsequently, the treatments described in FIG. 14 and the subsequent treatments are conducted. Since the other steps are the same as the steps according to the tenth embodiment, their duplicated descriptions will be omitted for the sake of simplicity. And, by conducting dicing on region 130 which will be a dicing line as shown in FIG. 4, semiconductor device 210 is completed.

By the manufacturing method according to the eleventh embodiment, it is possible to form a trench over the dicing line after forming the surface device structure on the first major surface. By forming the trench as described above, the infill buried in the trench is hardly affected by etching. Therefore, it is possible to bury an insulator in the trench for an infill. Therefore, it is easier to bury an insulator in the trench than to bury a semiconductor such as polysilicon in the trench.

Twelfth Embodiment

Now a method for manufacturing a semiconductor device according to a twelfth embodiment of the invention will be described below. The method for manufacturing a semiconductor device according to the twelfth embodiment is a method for manufacturing semiconductor device 220 shown in FIG. 5.

By the manufacturing method according to the twelfth embodiment, the BSG (infill 25) buried in trench 23 is also etched as described in FIG. 17, when the BSG on the second major surface side is etched by the manufacturing method according to the tenth embodiment. Since the other steps are the same as those of the manufacturing method according to the tenth embodiment, their duplicated descriptions will be omitted for the sake of simplicity. And, by conducting dicing on region 130 which will be a dicing line, semiconductor device 220 is completed.

By the manufacturing method according to the twelfth embodiment, any infill is not buried in the trench formed over the dicing line. Therefore, when the trench is formed such that trench extends through n⁻-type silicon semiconductor substrate, it is possible to isolate the chips from each other without conducting dicing, since only an insulator film and a collector electrode are between the chips.

Thirteenth Embodiment

Figure 20:
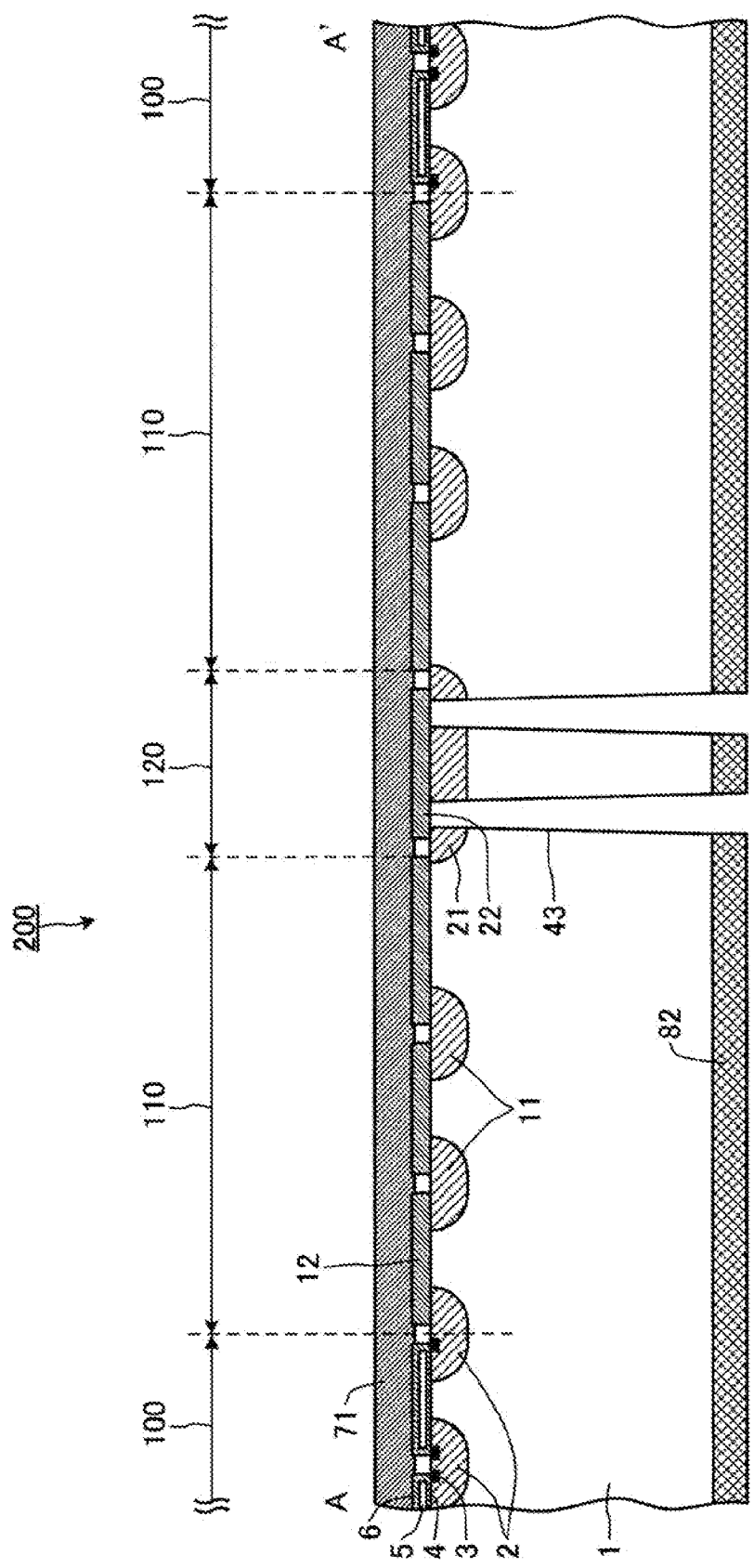
FIG. 20 is a cross sectional view describing the method for manufacturing the semiconductor device shown in FIG. 6.

Now a method for manufacturing a semiconductor device according to a thirteenth embodiment of the invention will be described below. The method for manufacturing a semiconductor device according to the thirteenth embodiment is a method for manufacturing semiconductor device 230 shown in FIG. 6. FIG. 20 is a cross sectional view describing the method for manufacturing the semiconductor device shown in FIG. 6.

By the manufacturing method according to the thirteenth embodiment, a front surface side structure is formed first on the first major surface side as shown in FIG. 12 and first reinforcing plate 71 is bonded onto the first major surface side. Then, semiconductor substrate 1 is polished from the second major surface side until a desired thickness is obtained and etching mask 82 having an opening between edge termination section 110 and region 30, which will be a dicing line, is formed as shown in FIG. 20. Then, trench 43 is formed in every chip from the second major surface side using etching mask 82. Since the subsequent manufacturing steps are the same as the manufacturing steps according to the tenth embodiment, their duplicated descriptions will be omitted for the sake of simplicity. By conducting dicing on region 130 that provides a dicing line as shown in FIG. 6, semiconductor device 230 is completed.

The manufacturing method according to the thirteenth embodiment exhibits the effects the same with the effects, which the manufacturing method according to the eleventh embodiment exhibits. Since the trench is not on the dicing line, dicing may be conducted with a conventional dicing machine with no problem.

Fourteenth Embodiment

Now a method for manufacturing a semiconductor device according to a fourteenth embodiment of the invention will be described below. The method for manufacturing a semiconductor device according to the fourteenth embodiment is a method for manufacturing semiconductor device 240 shown in FIG. 7.

According to the manufacturing method according to the fourteenth embodiment, trench 43 is formed by the manufacturing method according to the thirteenth embodiment (cf. FIG. 20) and the BSG buried in trench 43 is also etched simultaneously with the etching of the BSG on the second major surface side (cf. FIG. 17). Since the other manufacturing steps are the same as the manufacturing steps according to the thirteenth embodiment, their duplicated descriptions will be omitted for the sake of simplicity. By conducting dicing on region 130 that provides a dicing line as shown in FIG. 7, semiconductor device 240 is completed.

The manufacturing method according to the fourteenth embodiment exhibits the same effects as the manufacturing method according to the thirteenth embodiment.

Fifteenth Embodiment

Figure 21:
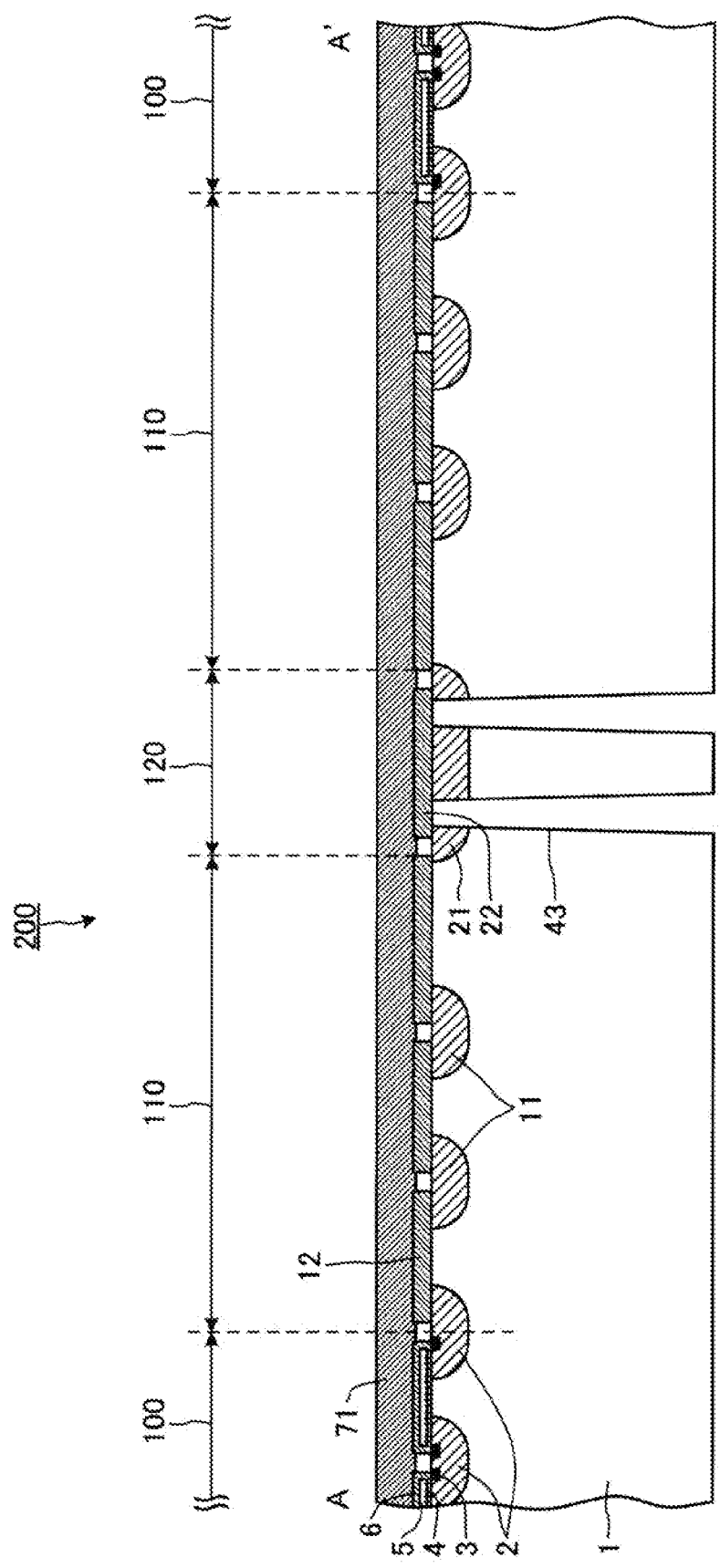
FIG. 21 is a cross sectional view describing the method for manufacturing the semiconductor device shown in FIG. 8.
Figure 22:
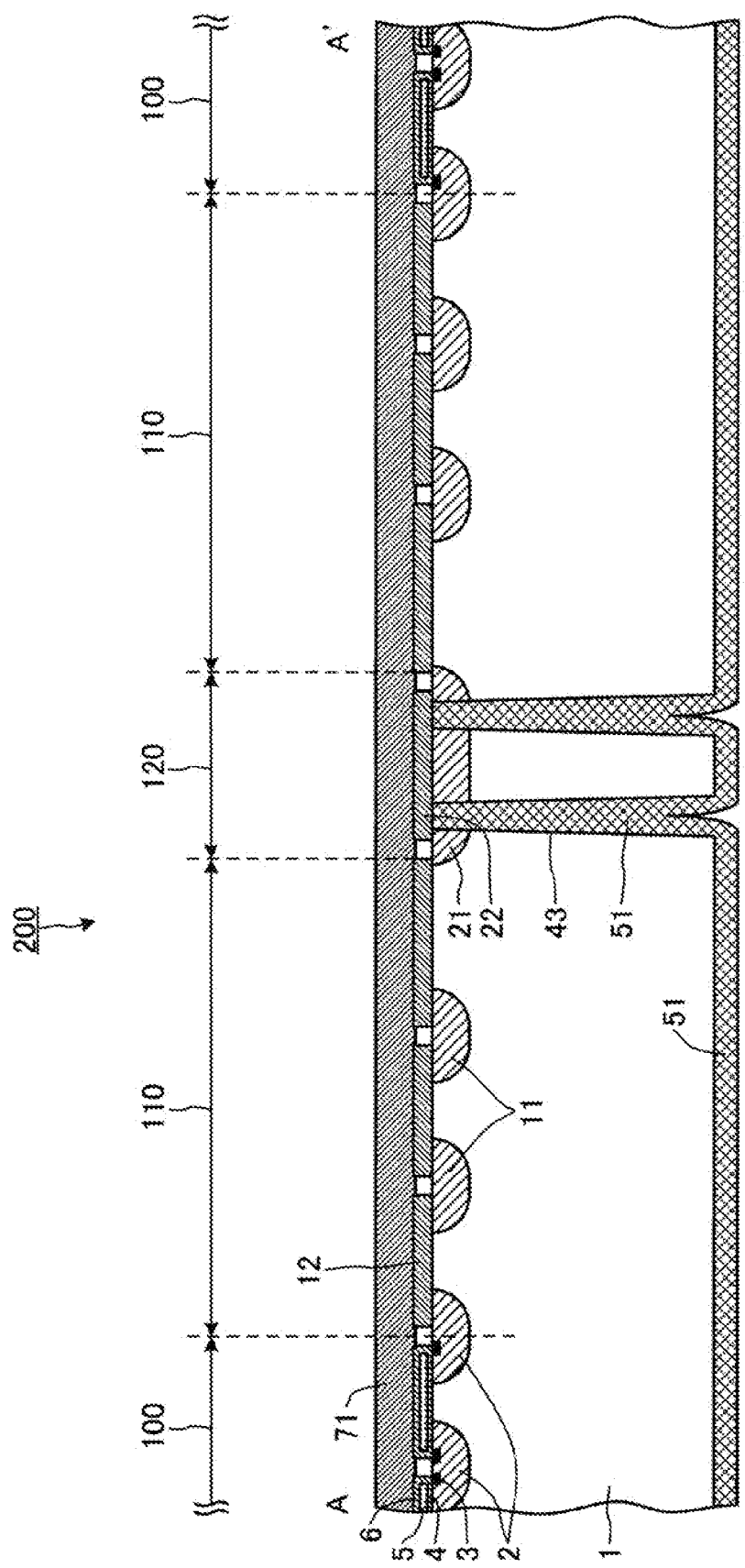
FIG. 22 is another cross sectional view describing the method for manufacturing the semiconductor device shown in FIG. 8.

Now a method for manufacturing a semiconductor device according to a fifteenth embodiment of the invention will be described below. The method for manufacturing a semiconductor device according to the fifteenth embodiment is a method for manufacturing semiconductor device 250 shown in FIG. 8. FIGS. 21 and 22 are cross sectional views describing the method for manufacturing the semiconductor device shown in FIG. 8.

By the manufacturing method according to the fifteenth embodiment, trench 43 is formed by the manufacturing method according to the thirteenth embodiment (cf. FIG. 20) and, then, etching mask 82 is etched as shown in FIG. 21. Then, p-type epitaxial layer 51 is grown epitaxially on the entire second major surface and inside trench 43 as shown in FIG. 22. Since the other manufacturing steps are the same as the manufacturing steps according to the fourteenth embodiment, their duplicated descriptions will be omitted for the sake of simplicity. By conducting dicing on region 130 that provides a dicing line as shown in FIG. 8, semiconductor device 250 is completed.

The manufacturing method according to the fifteenth embodiment facilitates forming simultaneously the p$^+$-type separation region that sustains the reverse blocking voltage of the device in the separation section and the p-type collector layer in the active section.

Sixteenth Embodiment

Figure 23:
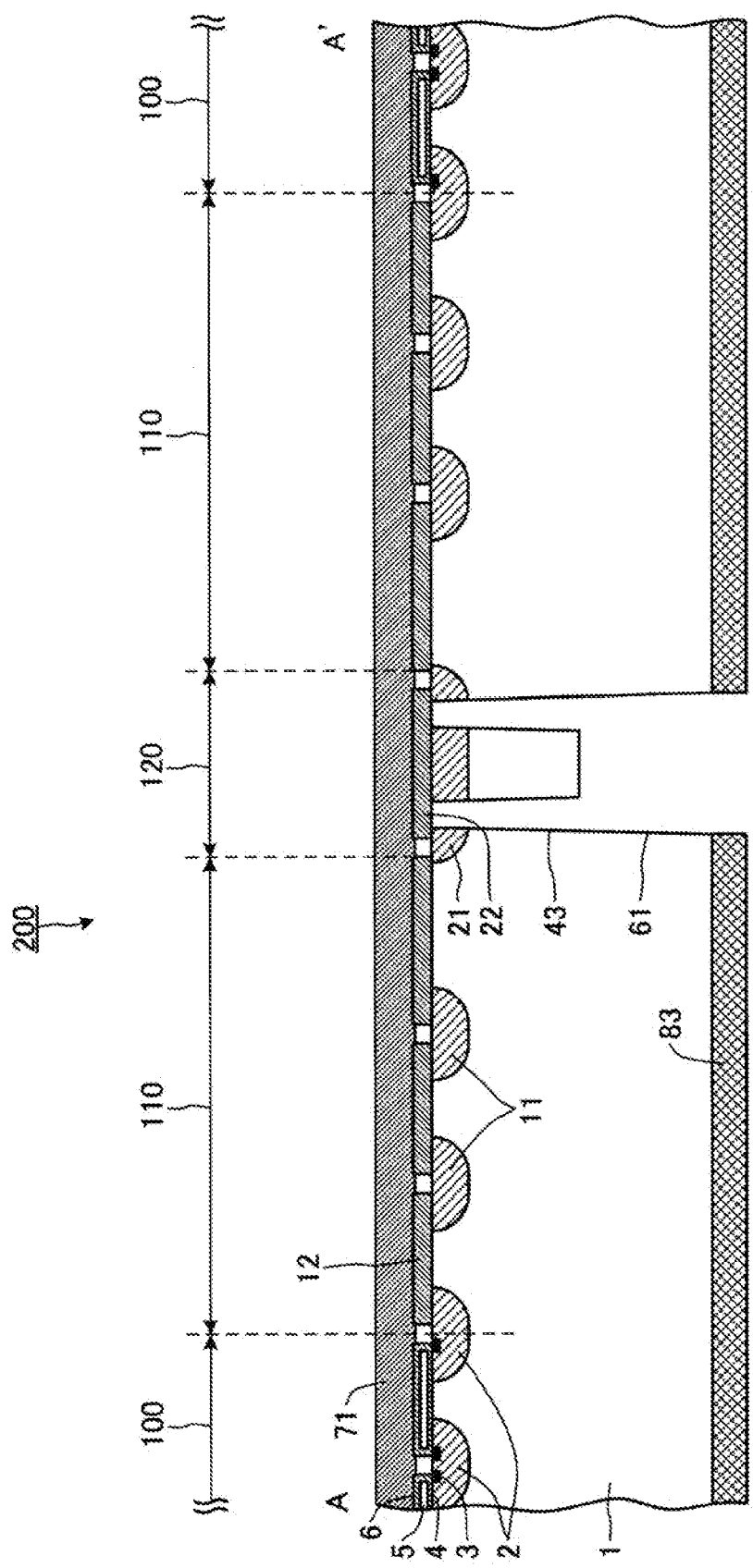
FIG. 23 is a cross sectional view describing the method for manufacturing the semiconductor device shown in FIG. 9.
Figure 24:
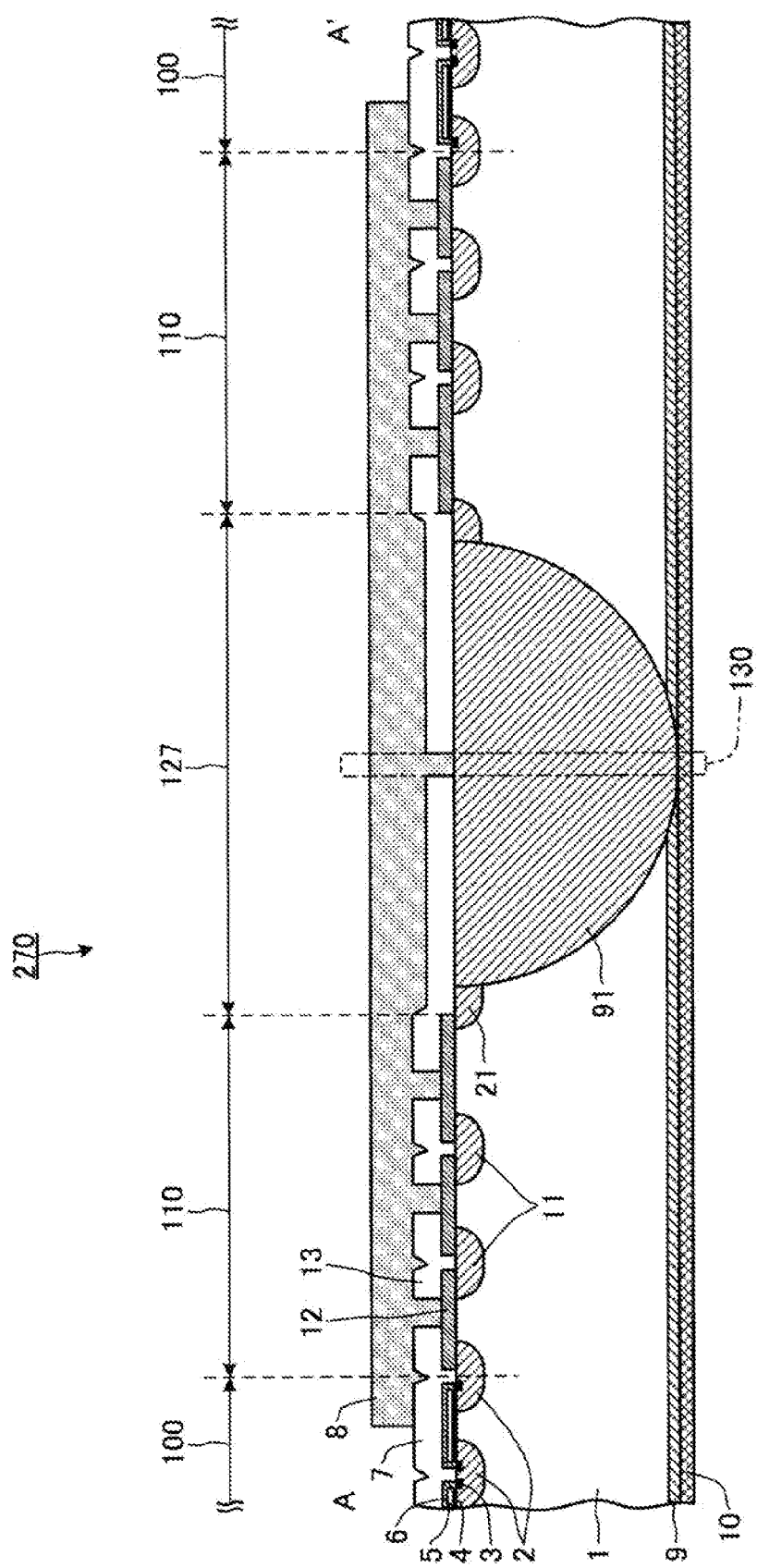
FIG. 24 is a cross sectional view which shows the structure of a conventional reverse blocking IGBT.

Now a method for manufacturing a semiconductor device according to a sixteenth embodiment of the invention will be described below. The method for manufacturing a semiconductor device according to the sixteenth embodiment is a method for manufacturing semiconductor device 260 shown in FIG. 9. FIG. 23 is a cross sectional view describing the method for manufacturing the semiconductor device shown in FIG. 9.

By the manufacturing method according to the sixteenth embodiment, trench 43 is formed by the manufacturing method according to the thirteenth embodiment (cf. FIG. 20) and, then, etching mask 82 is removed as shown in FIG. 23. Etching mask 83 having an opening straddling the dicing line and covering two first trenches 43 is formed, then etching is conducted using etching mask 83 to form second trench 61. It is preferable for second trench 61 to be shallower than first trench 43. Although not illustrated, infill 45 is buried only in first trench 43. In other words, any infill is not buried in trench 61. Since the other manufacturing steps are the same as the manufacturing steps according to the thirteenth embodiment, their duplicated descriptions will be omitted for the sake of simplicity. By conducting dicing on region 130 that provides a dicing line as shown in FIG. 9, semiconductor device 260 is completed.

By the manufacturing method according to the sixteenth embodiment, solder voids are prevented from occurring in soldering the diced chip in the module assembly.

As described above, the semiconductor device and the method for manufacturing the semiconductor device according to the invention facilitate preventing the reverse blocking voltage from decreasing and shorten the manufacturing time for the semiconductor device.

As described so far, the semiconductor device and the method for manufacturing the semiconductor device according to the invention are advantageous for providing power semiconductor devices used in electric power converters and such apparatuses. Especially, the semiconductor device and the method for manufacturing the semiconductor device according to the invention are well suited for providing bidirectional devices or reverse blocking devices.

Thus, semiconductor devices and methods for their manufacture have been described according to the present invention. Many modifications and variations may be made to the techniques and structures described and illustrated herein without departing from the spirit and scope of the invention. Accordingly, it should be understood that the devices and methods described herein are illustrative only and are not limiting upon the scope of the invention.

This application is based on and claims priority to Japanese Patent Application 2009-122440, filed on May 20, 2009. The disclosure of the priority application in its entirety, including the drawings, claims, and the specification thereof, is incorporated herein by reference.

What is claimed is:

1. A semiconductor device comprising:
    an active section in a semiconductor substrate of a first conductivity type;
    an edge termination section in the semiconductor substrate, the edge termination section having a voltage blocking structure, the edge termination section surrounding the active section;
    a separation section in an edge area of the semiconductor substrate, the separation section having a device separation structure, the separation section surrounding the edge termination section;
    the semiconductor device further comprising:
    a semiconductor region of a second conductivity type in a surface portion on a second major surface side of the semiconductor substrate, the semiconductor region being disposed beneath each of the active section, the edge termination section and the separation section;
    a back surface side electrode on the second conductivity type semiconductor region;
    a first semiconductor region of the second conductivity type in a surface portion on a first major surface side of the semiconductor substrate,
    an insulator film on the first semiconductor the region;
    a trench formed from the second major surface side of the semiconductor substrate;
    a second semiconductor region of the second conductivity type formed along a side wall of the trench, the second semiconductor region being in contact with the semiconductor region which is disposed beneath each of the active section, the edge termination section and the separation section and with the first semiconductor region; and
    the second semiconductor region comprising a boundary portion between the side wall of the trench in an opening thereof and a second major surface of the semiconductor substrate, wherein either (i) the boundary portion of the second semiconductor region is wider than another portion of the second semiconductor region excluding the boundary portion or (ii) the boundary portion of the second semiconductor region is doped more heavily than the other portion of the second semiconductor region.

2. The semiconductor device according to claim 1, comprising a plurality of active sections, wherein the trench is over a dicing line for cutting adjacent ones of the active sections apart.

3. The semiconductor device according to claim 1, comprising a plurality of active sections, wherein the trench is not over a dicing line for cutting adjacent ones of the active sections apart.

4. The semiconductor device according to claim 3, further comprising a branch trench extended from the trench to the dicing line.

5. The semiconductor device according to claim 3, wherein the semiconductor region which is disposed beneath each of the active section, the edge termination section and the separation section and the second semiconductor region comprise an epitaxial region of the second conductivity type.

6. The semiconductor device according to any of claim 1, further comprising an insulator buried in the trench.

7. The semiconductor device according to claim 6, wherein the insulator comprises borosilicate glass.

8. The semiconductor device according to claim 1, wherein the trench is formed through the semiconductor substrate and no insulator is buried in the trench.

9. The semiconductor device according to claim 1, wherein a plurality of the separation section is disposed discontinuously around the edge termination section.

10. A method for manufacturing a semiconductor device comprising an active section in a semiconductor substrate of a first conductivity type, an edge termination section in the semiconductor substrate, the edge termination section having a voltage blocking structure, the edge termination section surrounding the active section, and a separation section in an edge area of the semiconductor substrate, the separation section having a device separation structure, the separation section surrounding the edge termination section, the method comprising the steps of:
- (a) forming a surface device structure on a first major surface of a semiconductor substrate in an active section, forming a first semiconductor region of a second conductivity type in a surface portion on a first major surface side of the semiconductor substrate in a separation section and forming an insulator film on the first semiconductor region;
- (b) forming a trench from a second major surface side of the semiconductor substrate in the separation section;
- (c) forming a second semiconductor region of the second conductivity type on a side wall of the trench such that the second semiconductor region is connected to the first semiconductor region;
- (d) forming a front surface electrode on a first major surface of the semiconductor substrate;
- (e) forming a semiconductor region of the second conductivity type on a second major surface of the semiconductor substrate; and
- (f) forming a back surface electrode on the semiconductor region of the second conductivity type that is on the second major surface of the semiconductor substrate.

11. The method according to claim 10, the method further comprises the step of (g) burying an insulator in the trench.

12. The method according to claim 10, wherein the method further comprises the step of (h) burying borosilicate glass in the trench, the step (h) being conducted between the steps (b) and (c), and the step (c) comprises a thermal treatment diffusing an impurity of the second conductivity type from the borosilicate glass to form the second semiconductor region.

13. The method according to claim 10, wherein the trench is formed using the insulator film for an etching stopper in the step (b).

14. The method according to claim 10, wherein the trench is formed over a dicing line for cutting adjacent ones of the active regions apart.

15. The method according to claim 10, wherein the trench is not formed over a dicing line for cutting adjacent ones of the active regions apart.

16. The method according to claim 15, wherein the second semiconductor region and the semiconductor region of the second conductivity type that is on the second major surface of the semiconductor substrate are formed simultaneously by epitaxial growth from the semiconductor substrate.

17. The method according to claim 15, wherein the step (b) further comprises forming a branch trench extended to the dicing line from the trench formed in the separation section.

* * * * *